US012641916B2

(12) United States Patent
Tomioka et al.

(10) Patent No.: US 12,641,916 B2
(45) Date of Patent: May 26, 2026

(54) PHOTOVOLTAIC CELL DEVICE

(71) Applicant: Japan Display Inc., Tokyo (JP)

(72) Inventors: Yasushi Tomioka, Tokyo (JP); Junji Kobashi, Tokyo (JP); Shinichiro Oka, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 328 days.

(21) Appl. No.: 18/350,203

(22) Filed: Jul. 11, 2023

(65) Prior Publication Data

US 2024/0021747 A1 Jan. 18, 2024

(30) Foreign Application Priority Data

Jul. 12, 2022 (JP) ................................. 2022-111936

(51) Int. Cl.
*H10F 77/42* (2025.01)
*G02F 1/1347* (2006.01)
*G02F 1/137* (2006.01)
*G02F 1/139* (2006.01)
*H02S 40/22* (2014.01)

(52) U.S. Cl.
CPC ....... *H10F 77/484* (2025.01); *G02F 1/13471* (2013.01); *G02F 1/13718* (2013.01); *G02F 1/1396* (2013.01); *H02S 40/22* (2014.12); *H10F 77/488* (2025.01); *G02F 2201/50* (2013.01)

(58) Field of Classification Search
CPC ............... H10F 77/484; G02F 1/13471; G02F 1/1396; G02F 1/13718
See application file for complete search history.

(56) References Cited

U.S. PATENT DOCUMENTS

| | | | | |
|---|---|---|---|---|
| 2009/0027872 A1* | 1/2009 | Debije | ................... | G02B 6/001 |
| | | | | 362/601 |
| 2012/0242918 A1* | 9/2012 | Valyukh | .............. | G02F 1/13718 |
| | | | | 349/33 |
| 2016/0033698 A1* | 2/2016 | Escuti | ................... | G02F 1/1334 |
| | | | | 349/194 |
| 2023/0335660 A1* | 10/2023 | Yoshida | ................... | G02B 5/18 |

FOREIGN PATENT DOCUMENTS

| | | | | |
|---|---|---|---|---|
| JP | 2017-522601 A | 8/2017 | | |
| WO | WO-2008003004 A2 * | 1/2008 | .......... | H10F 77/488 |
| WO | WO-2021132615 A1 * | 7/2021 | ............. | H10F 77/42 |

* cited by examiner

*Primary Examiner* — Kourtney R S Carlson
(74) *Attorney, Agent, or Firm* — Maier & Maier, PLLC

(57) ABSTRACT

According to one embodiment, a photovoltaic cell device includes a transparent substrate including a first side surface, a second side surface, and a third side surface, a first liquid crystal layer, a second liquid crystal layer, a first photovoltaic cell opposed to the first side surface, a second photovoltaic cell opposed to the second side surface, and a third photovoltaic cell opposed to the third side surface. The first liquid crystal layer comprises a first reflective surface. The second liquid crystal layer comprises a second reflective surface. In plan view, an angle formed by a normal of the first reflective surface and a normal of the second reflective surface is greater than 0° but less than 180°.

13 Claims, 19 Drawing Sheets

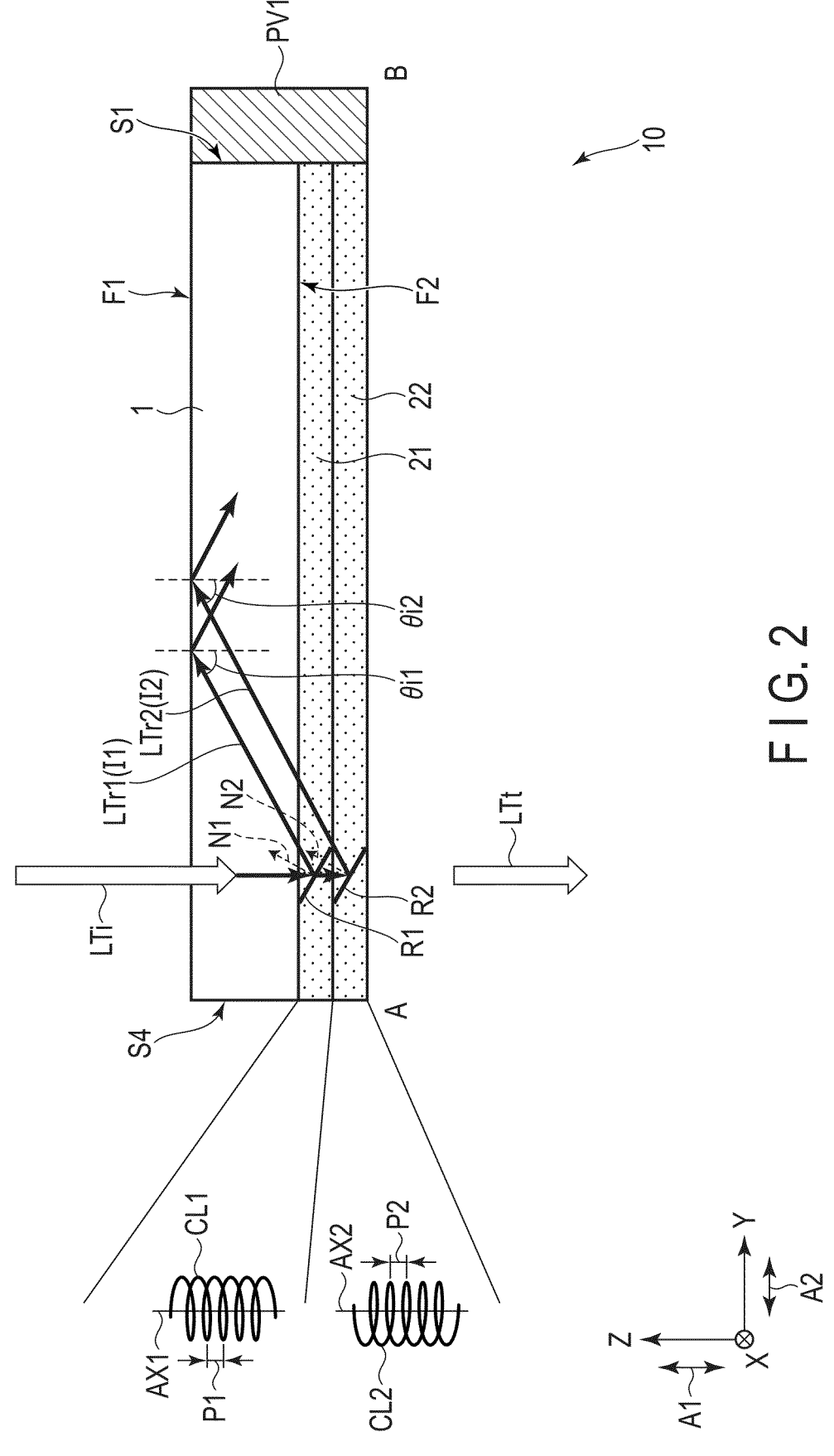
F I G. 2

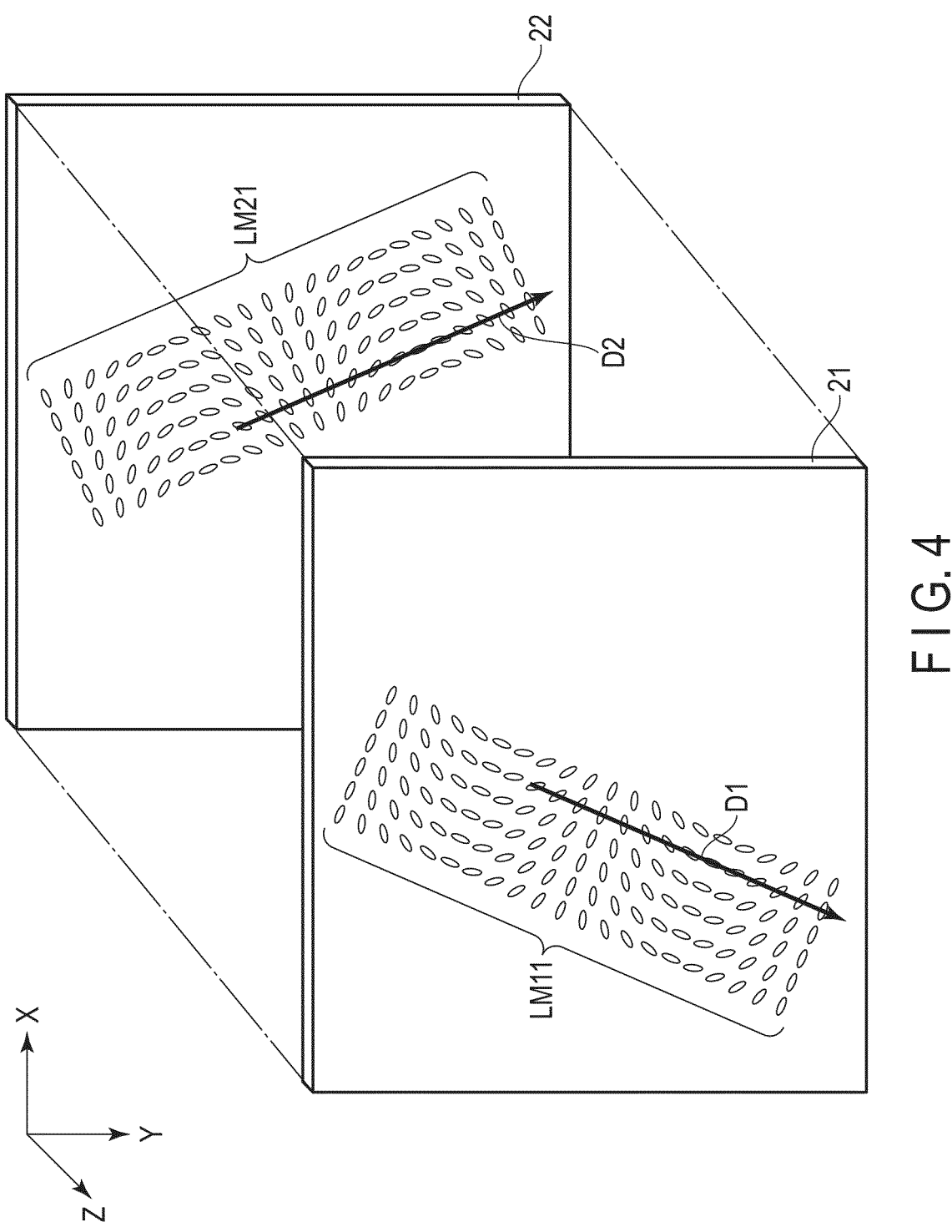
F I G. 4

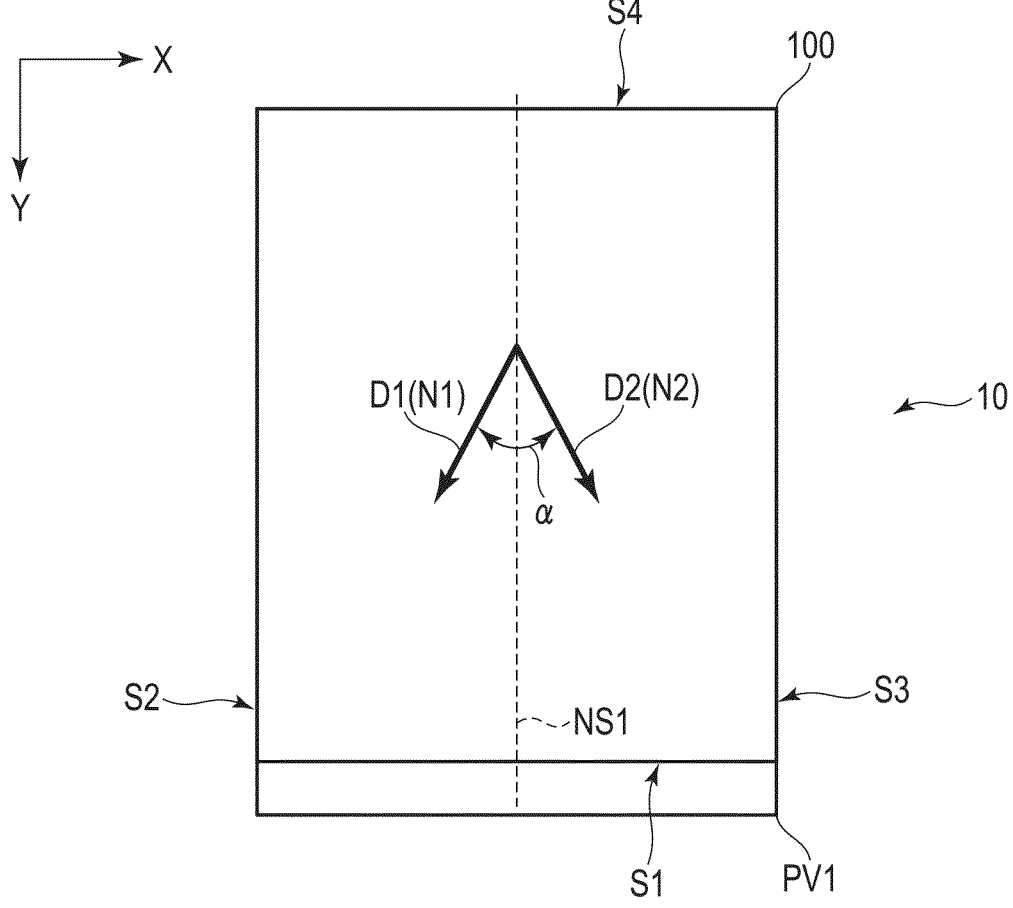
F I G. 5

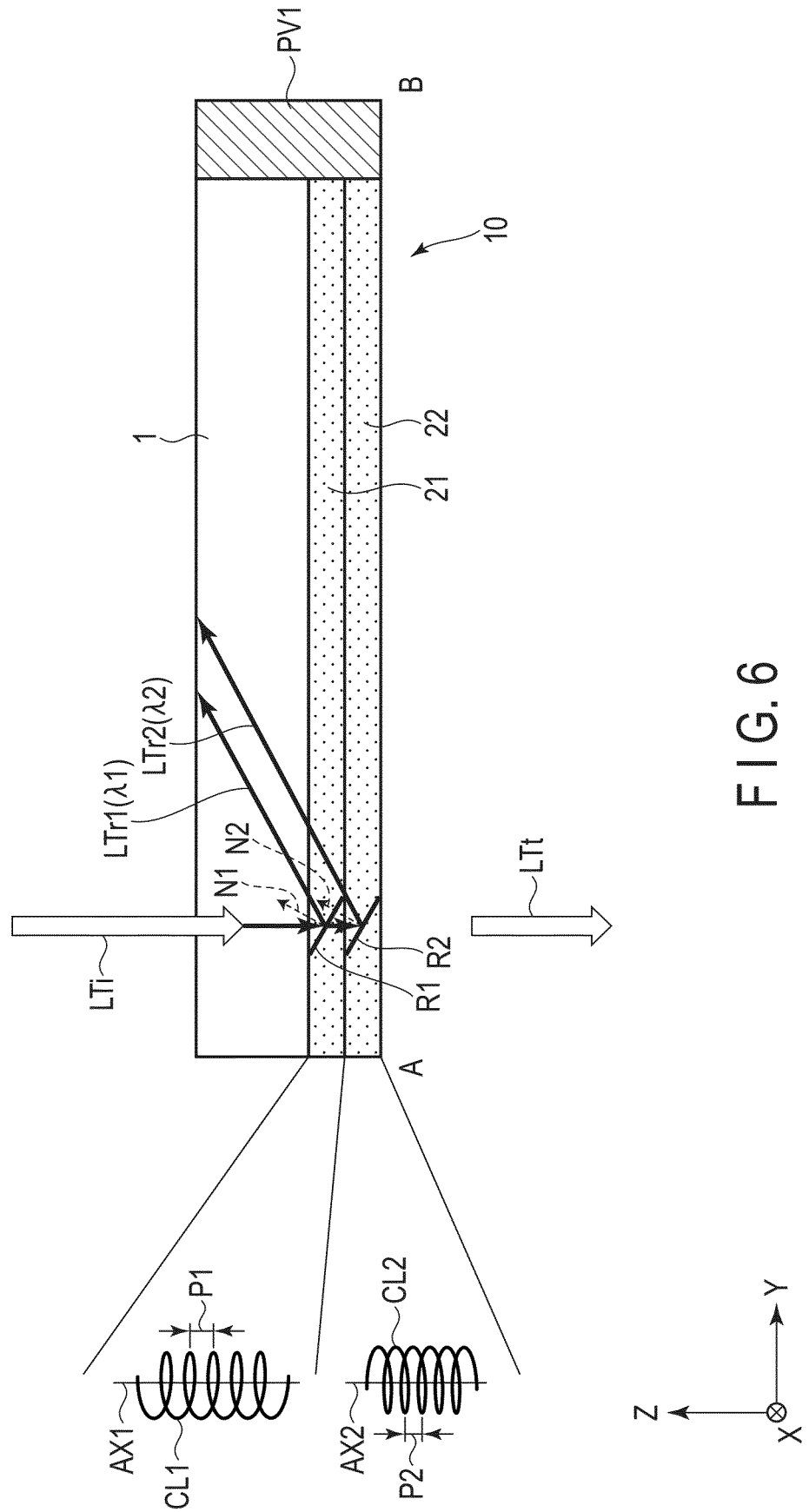
F I G. 6

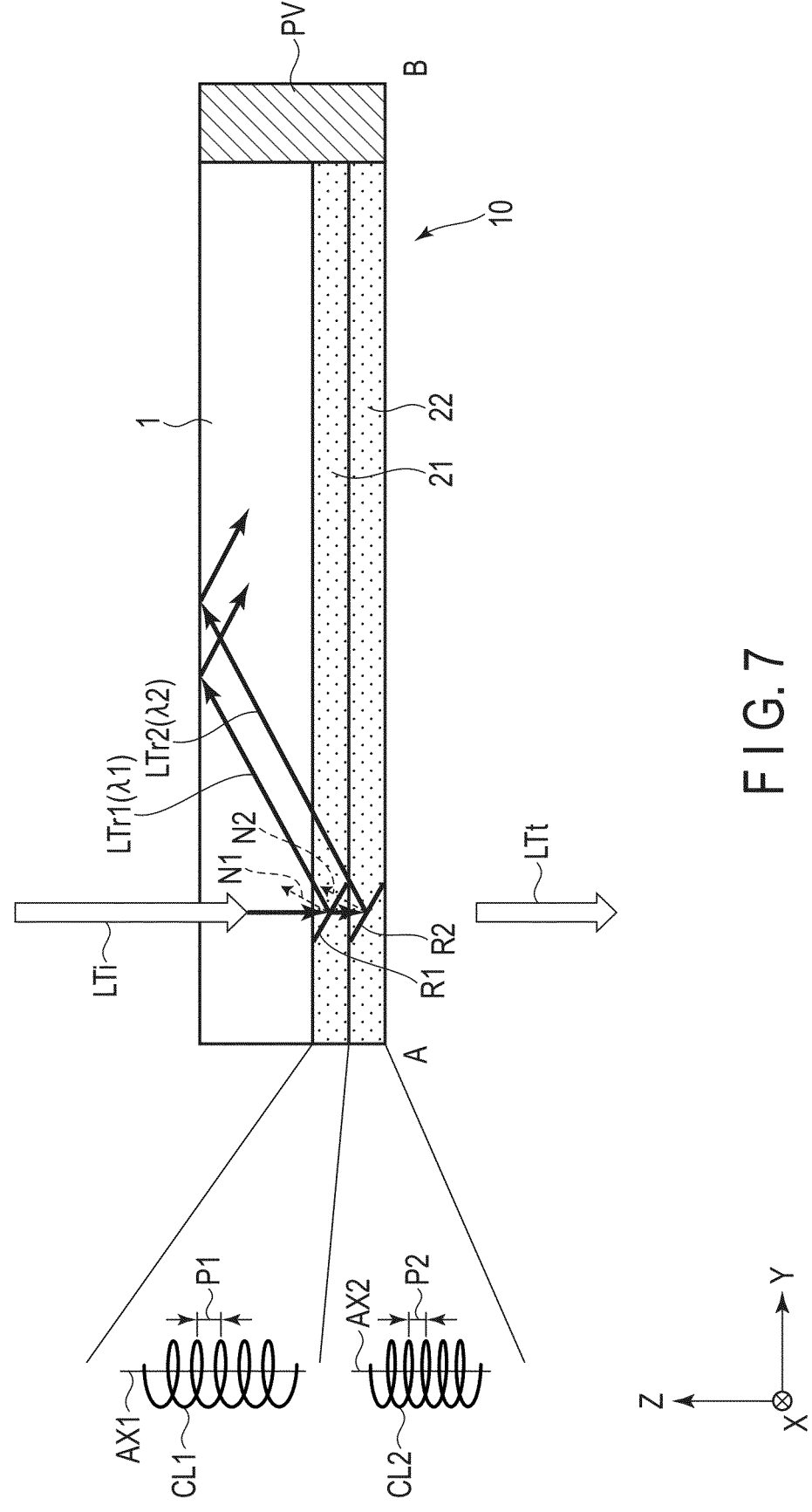
F I G. 7

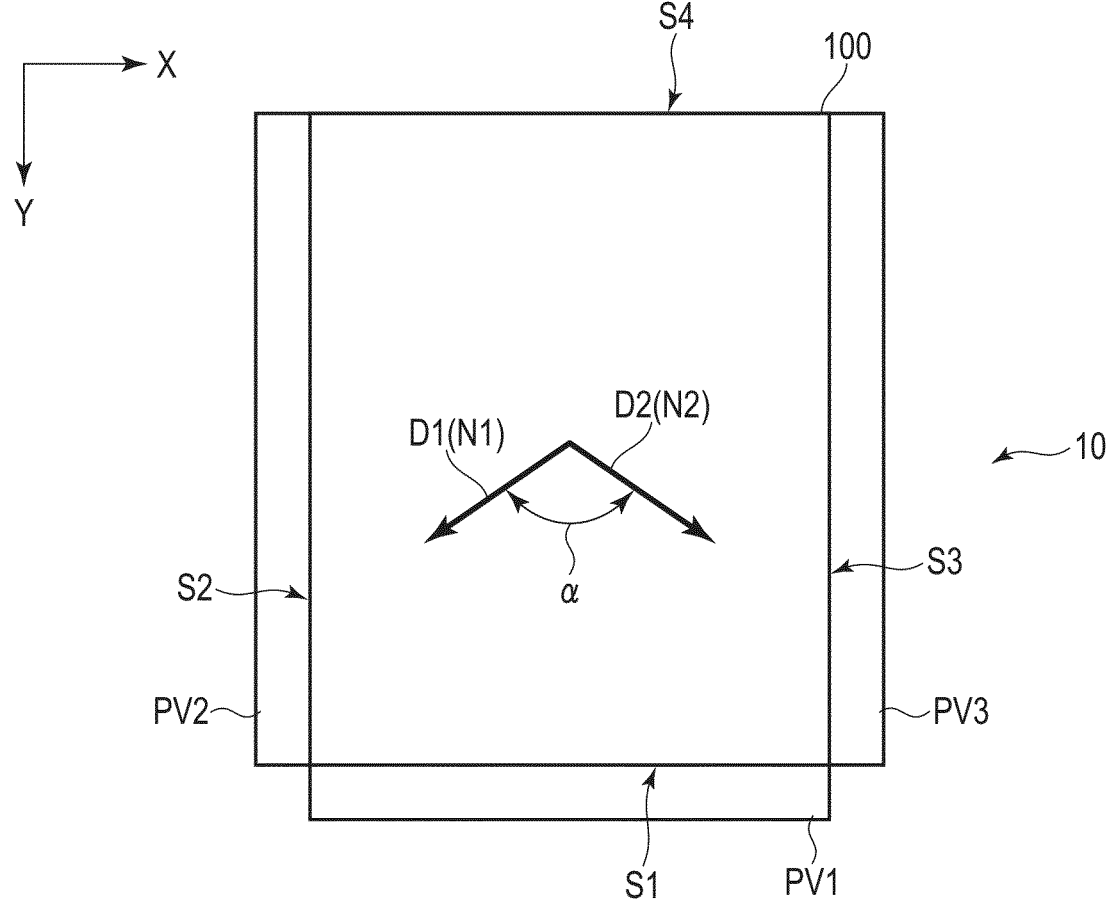
F I G. 8

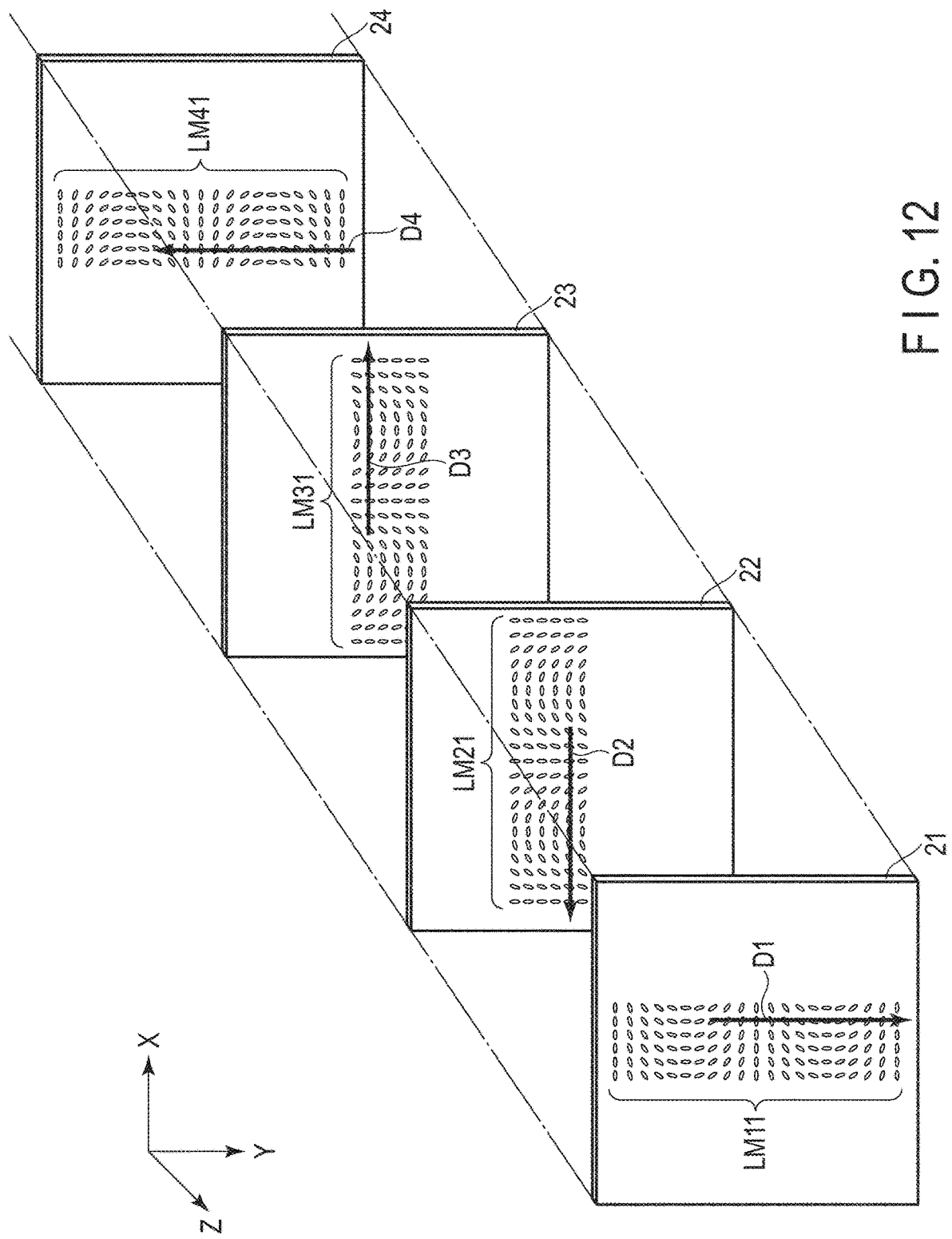
F I G. 12

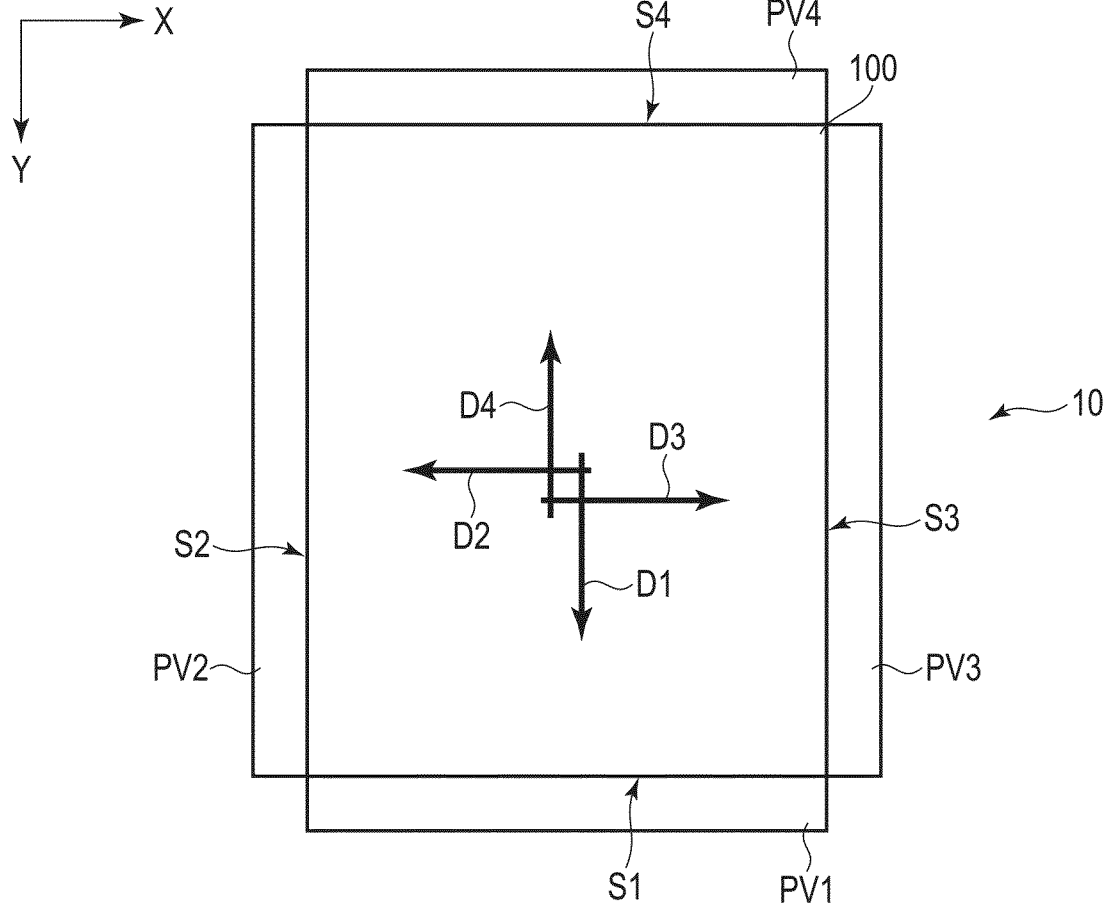
F I G. 13

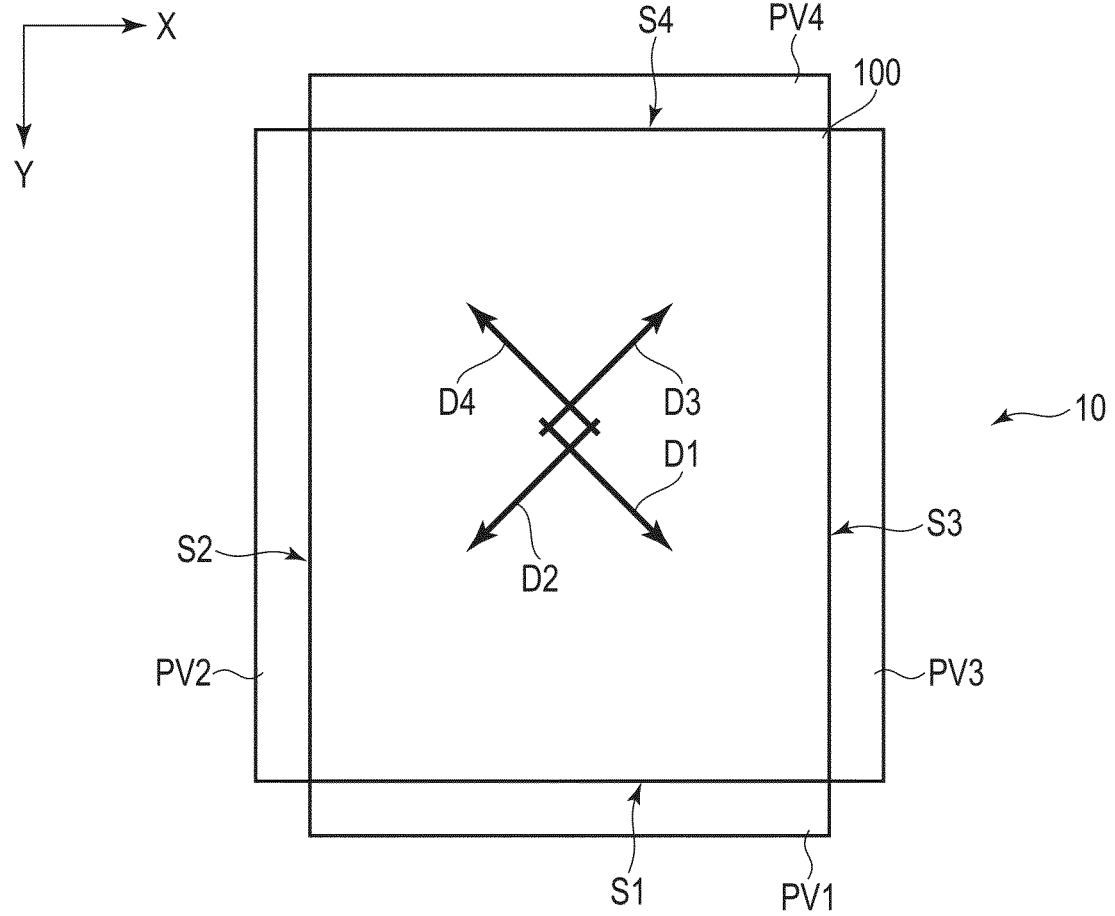
F I G. 14

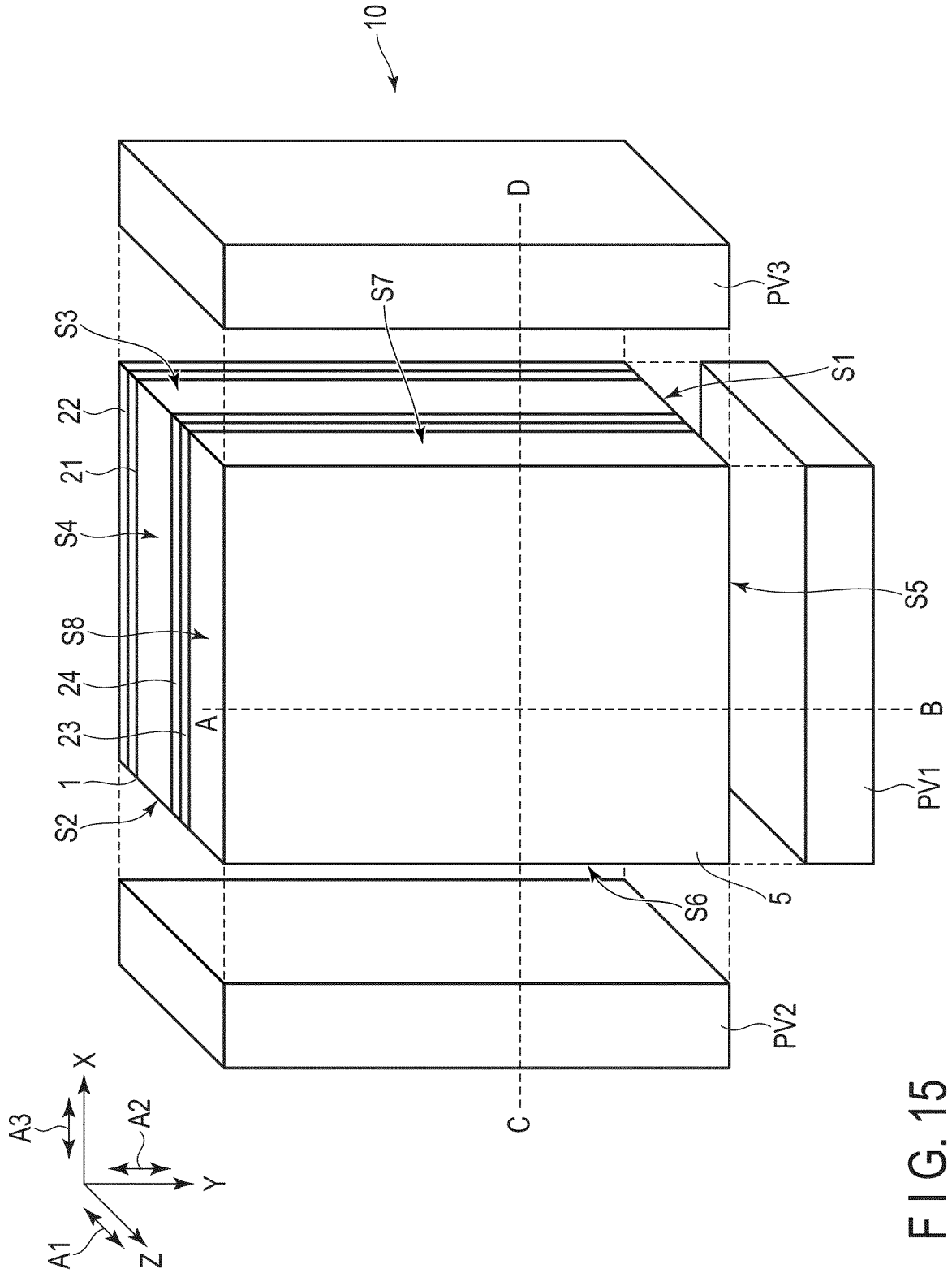
F I G. 15

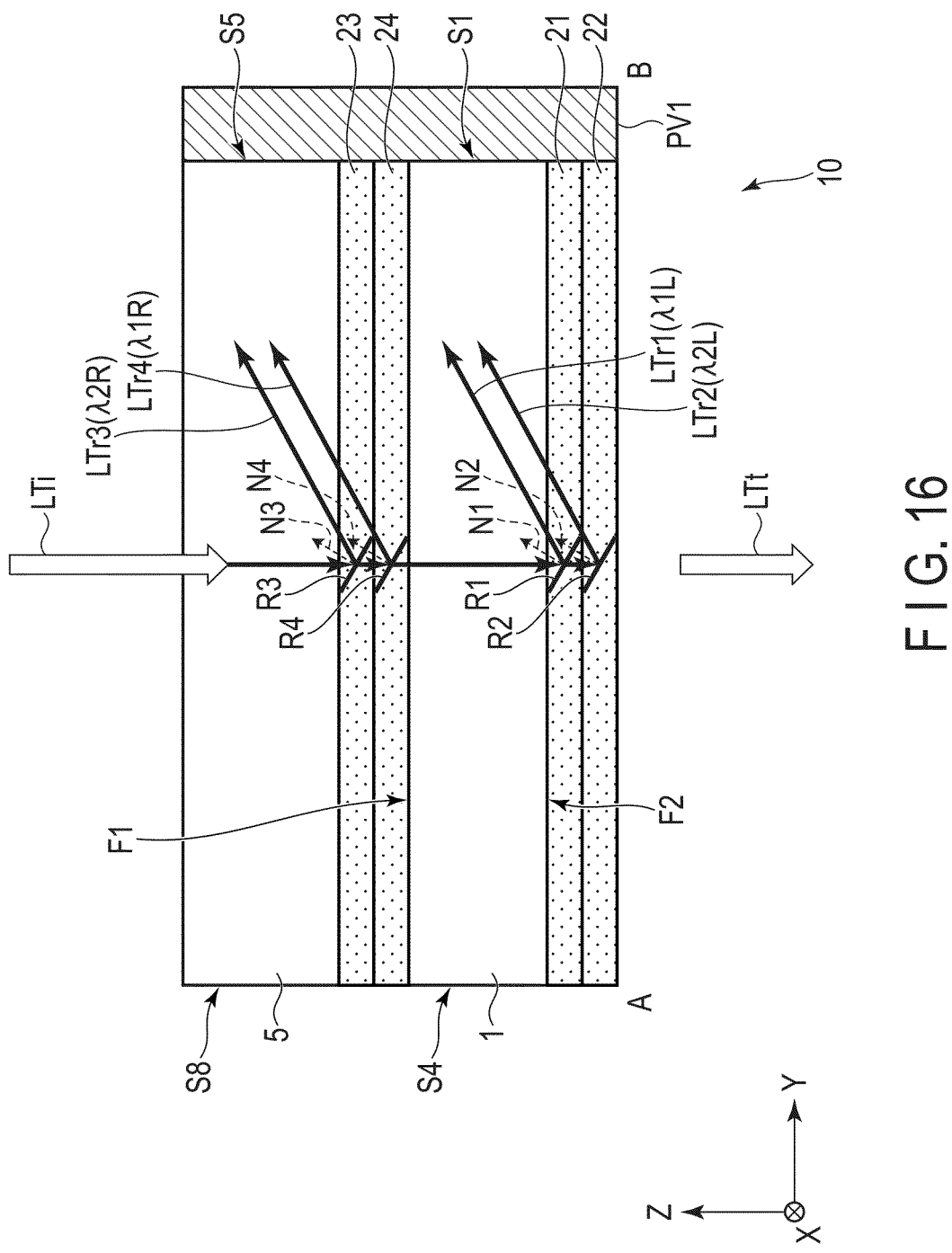
F I G. 16

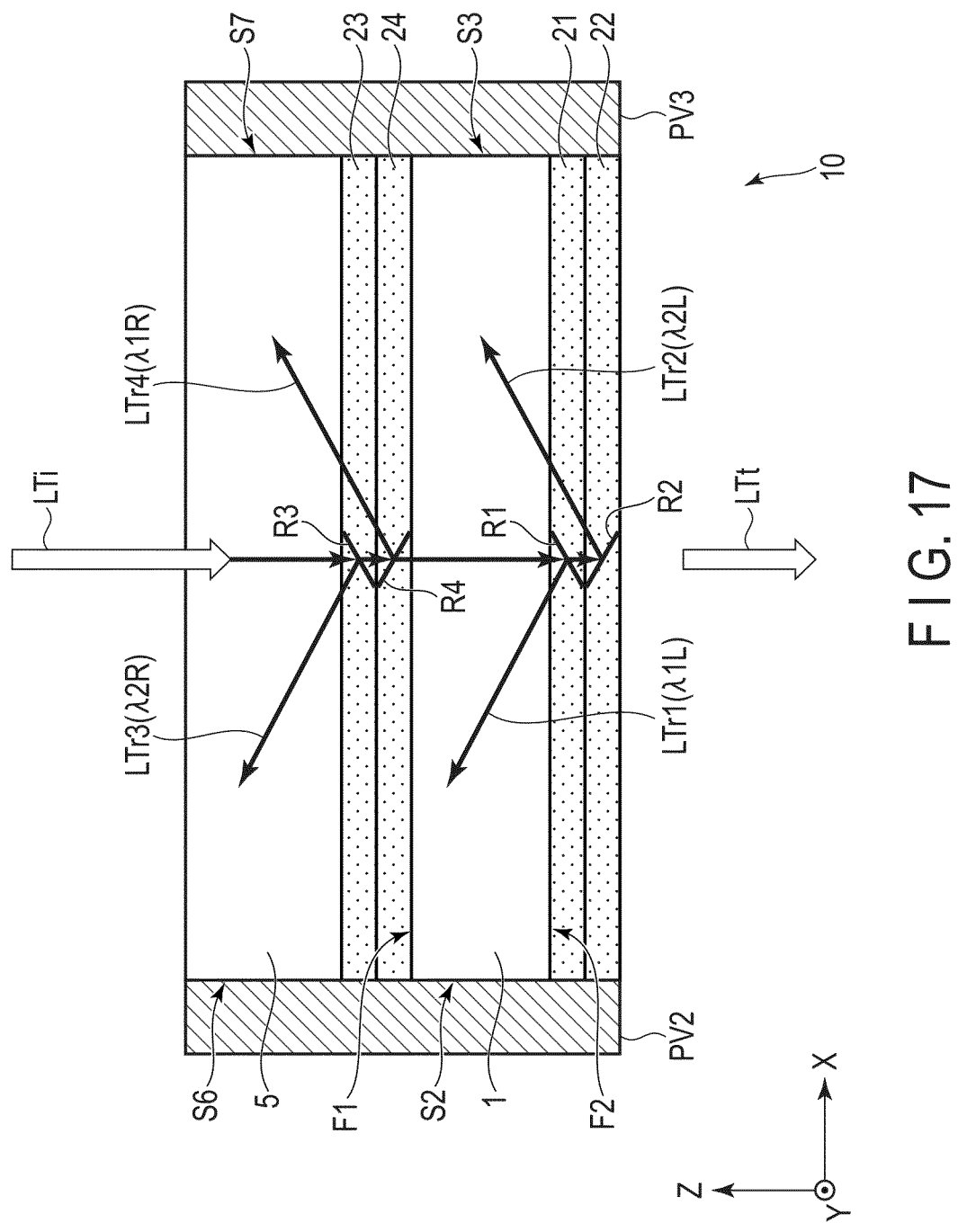
F I G. 17

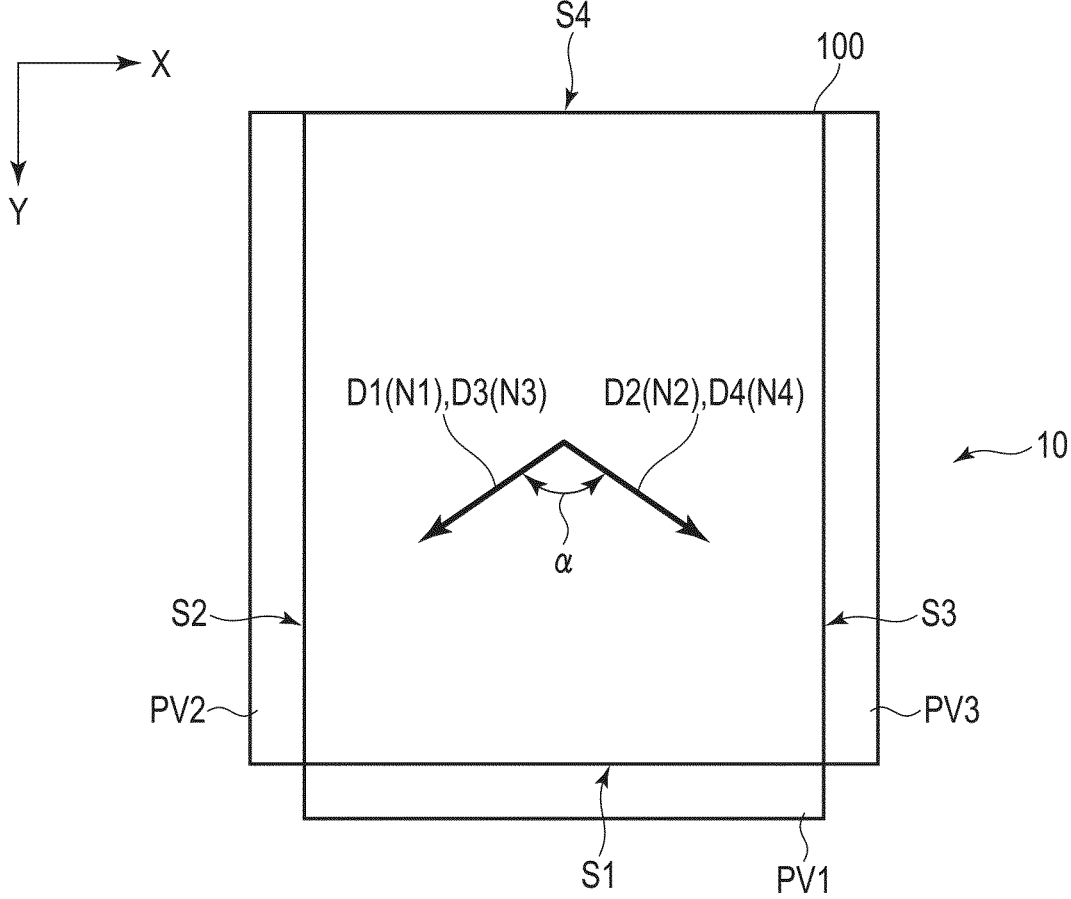
F I G. 18

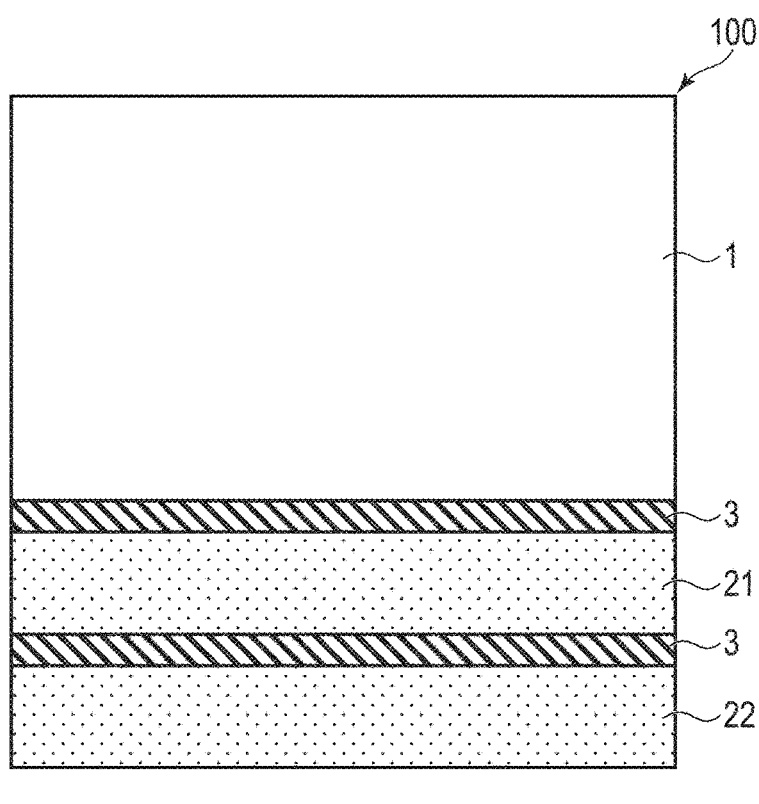
F I G. 19
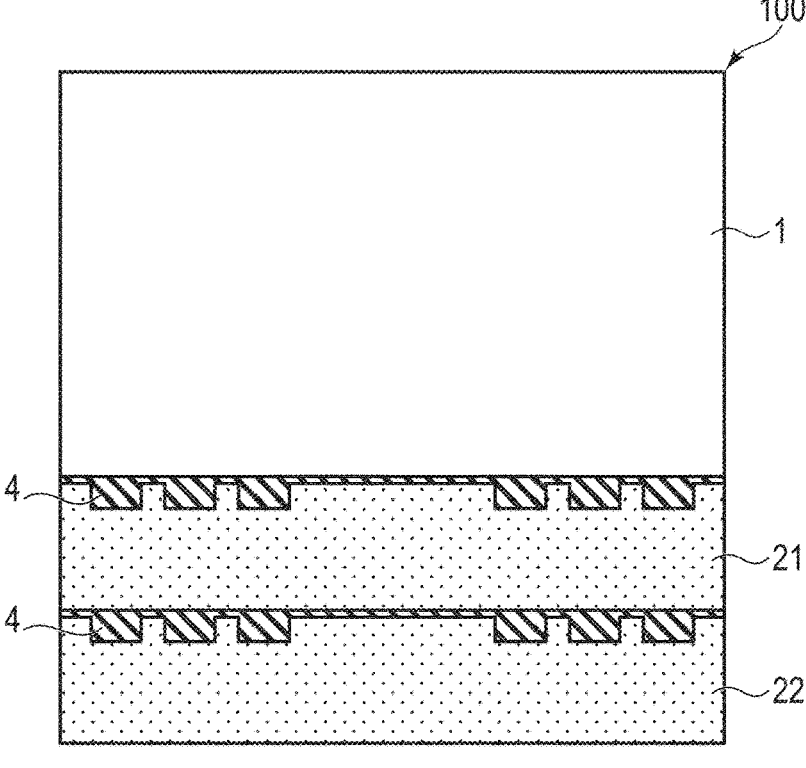
F I G. 20

PHOTOVOLTAIC CELL DEVICE

CROSS-REFERENCE TO RELATED APPLICATIONS

This application is based upon and claims the benefit of priority from Japanese Patent Application No. 2022-111936, filed Jul. 12, 2022, the entire contents of which are incorporated herein by reference.

FIELD

Embodiments described herein relate generally to a photovoltaic cell device.

BACKGROUND

For example, liquid crystal polarization gratings for which liquid crystal materials are used have been proposed. Diffraction efficiency in the liquid crystal polarization gratings depends on the angle of incidence. If the liquid crystal polarization gratings are applied to photovoltaic cell devices, the angle of incidence of solar light changes with time and season and the diffraction efficiency fluctuates. If the photovoltaic cell devices are installed in buildings or moving bodies, it is required that the fluctuations of power generation efficiency due to the diffraction efficiency be suppressed.

BRIEF DESCRIPTION OF THE DRAWINGS

FIG. 2 is a cross-sectional view along line A-B of the photovoltaic cell device 10 shown in FIG. 1.

FIG. 4 is a diagram showing an example of the alignment patterns of liquid crystal molecules LM11 and liquid crystal molecules LM21 shown in FIG. 3.

FIG. 5 is a plan view showing the relationship between light-guide directions D1 and D2.

FIG. 6 is another cross-sectional view along line A-B of the photovoltaic cell device 10 shown in FIG. 1.

FIG. 7 is another cross-sectional view along line A-B of the photovoltaic cell device 10 shown in FIG. 1.

FIG. 8 is another plan view of the photovoltaic cell device 10.

FIG. 12 is a diagram showing an example of the alignment patterns of the liquid crystal molecules LM11 of the liquid crystal layer 21 and liquid crystal molecules LM41 of a liquid crystal layer 24 shown in FIG. 10, and the liquid crystal molecules LM21 of the liquid crystal layer 22 and liquid crystal molecules LM31 of a liquid crystal layer 23 shown in FIG. 11.

FIG. 13 is a plan view showing the relationship between light-guide directions D1 to D4.

FIG. 14 is another plan view showing the relationship between the light-guide directions D1 to D4.

FIG. 15 is another exploded perspective view of the photovoltaic cell device 10.

FIG. 16 is a cross-sectional view along line A-B of the photovoltaic cell device 10 shown in FIG. 15.

FIG. 17 is a cross-sectional view along line C-D of the photovoltaic cell device 10 shown in FIG. 15.

FIG. 18 is a plan view showing the relationship between the light-guide directions D1 to D4.

FIG. 19 is a diagram for explaining alignment films 3 which can be interposed between the transparent substrate 1 and a liquid crystal layer and between stacked liquid crystal layers.

FIG. 20 is a diagram for explaining structures 4 having irregularities which can be interposed between the transparent substrate 1 and a liquid crystal layer and between stacked liquid crystal layers.

DETAILED DESCRIPTION

Figure 1:
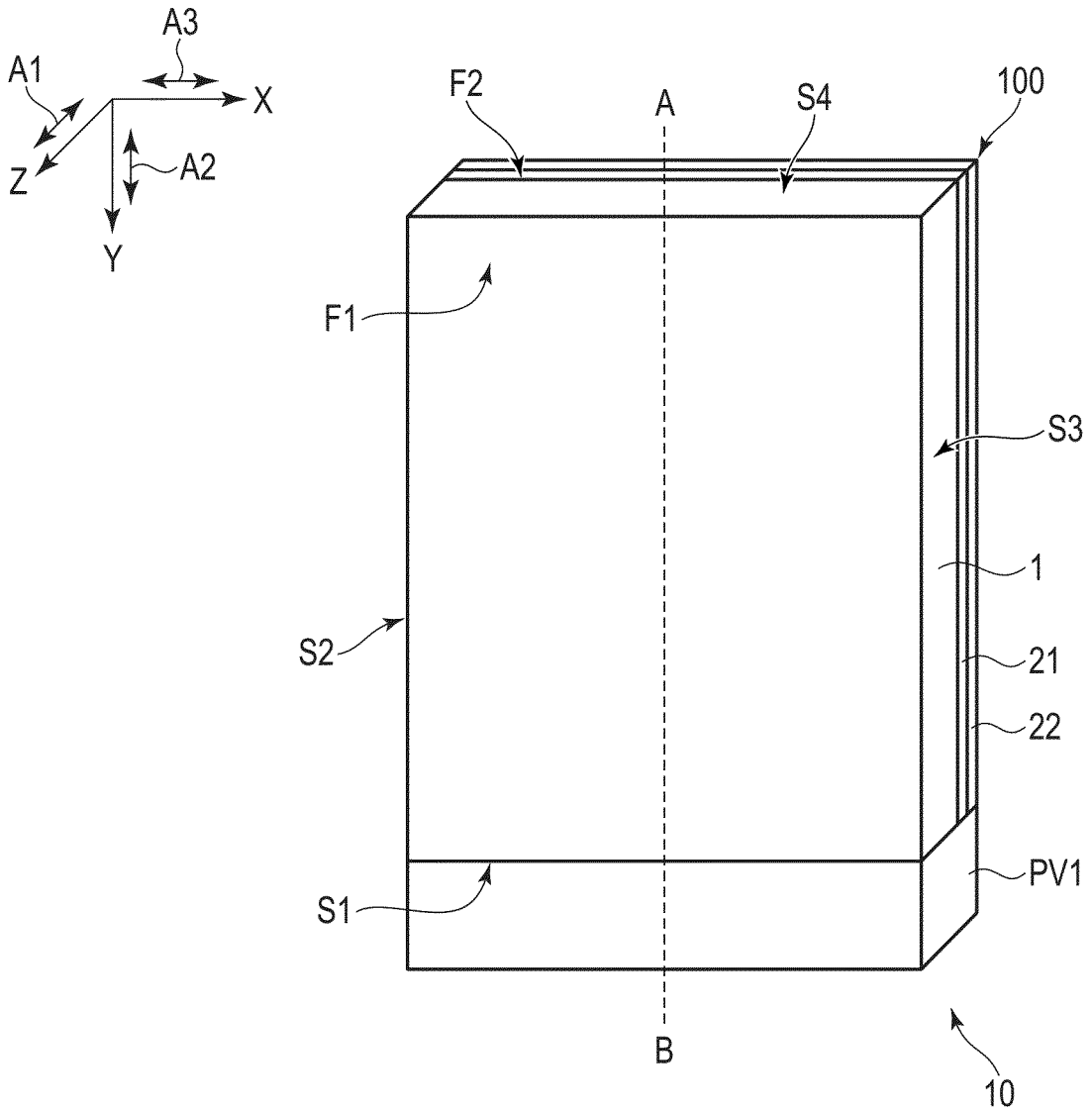
FIG. 1 is a perspective view showing an example of a photovoltaic cell device 10.

Embodiments described herein aim to provide a photovoltaic cell device which can suppress the fluctuations of power generation efficiency.

In general, according to one embodiment, a photovoltaic cell device comprises a transparent substrate comprising a first main surface, a second main surface opposed to the first main surface, a first side surface, a second side surface intersecting the first side surface, a third side surface opposed to the second side surface, and a fourth side surface opposed to the first side surface, a first liquid crystal layer disposed on the second main surface side of the transparent substrate and comprising a first cholesteric liquid crystal, a second liquid crystal layer disposed on the first liquid crystal layer and comprising a second cholesteric liquid crystal, a first photovoltaic cell opposed to the first side surface, a second photovoltaic cell opposed to the second side surface, and a third photovoltaic cell opposed to the third side surface. The first liquid crystal layer comprises a first reflective surface inclined with respect to the second main surface. The second liquid crystal layer comprises a second reflective surface inclined with respect to the second main surface. In plan view, an angle formed by a normal of the first reflective surface and a normal of the second reflective surface is greater than 0° but less than 180°.

According to the embodiments, a photovoltaic cell device which can suppress the fluctuations of power generation efficiency can be provided.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

In the drawings, an X-axis, a Y-axis, and a Z-axis orthogonal to each other are described to facilitate understanding as necessary. A direction along the Z-axis is referred to as a Z direction or a first direction A1, a direction along the Y-axis is referred to as a Y direction or a second direction A2, and a direction along the X-axis is referred to as an X direction or a third direction A3. A plane defined by the X-axis and the Y-axis is referred to as an X-Y plane, a plane defined by the X-axis and the Z-axis is referred to as an X-Z plane, and a plane defined by the Y-axis and the Z-axis is referred to as a Y-Z plane. Viewing towards the X-Y plane is referred to as plan view.

FIG. 1 is a perspective view showing an example of a photovoltaic cell device 10.

The photovoltaic cell device 10 comprises a liquid crystal optical element 100 and a photovoltaic cell PV1. The liquid crystal optical element 100 comprises a transparent substrate 1, a liquid crystal layer 21, and a liquid crystal layer 22. The liquid crystal optical element 100 may comprise alignment films interposed between the transparent substrate 1 and the liquid crystal layer 21 and between the liquid crystal layer 21 and the liquid crystal layer 22, which are not shown in FIG. 1. In addition, the liquid crystal optical element 100 may comprise structures interposed between the transparent substrate 1 and the liquid crystal layer 21 and between the liquid crystal layer 21 and the liquid crystal layer 22. Specific examples of the alignment films and the structures will be described later.

The transparent substrate 1 is composed of, for example, a transparent glass plate or a transparent synthetic resin plate. The transparent substrate 1 may be composed of, for example, a transparent synthetic resin plate having flexibility. The transparent substrate 1 can assume an arbitrary shape. For example, the transparent substrate 1 may be curved.

In the present specification, "light" includes visible light and invisible light. For example, the wavelength of the lower limit of the visible light range is greater than or equal to 360 nm but less than or equal to 400 nm, and the wavelength of the upper limit of the visible light range is greater than or equal to 760 nm but less than or equal to 830 nm. Visible light includes a first component (blue component) of a first wavelength band (for example, 400 nm to 500 nm), a second component (green component) of a second wavelength band (for example, 500 nm to 600 nm), and a third component (red component) of a third wavelength band (for example, 600 nm to 700 nm). Invisible light includes ultraviolet rays of a wavelength band shorter than the first wavelength band and infrared rays of a wavelength band longer than the third wavelength band.

In the present specification, to be "transparent" should preferably be to be colorless and transparent. Note that to be "transparent" may be to be translucent or to be colored and transparent. The transparent substrate 1 is formed into the shape of a flat plate along the X-Y plane, and comprises a main surface F1, a main surface F2, a side surface S1, a side surface S2, a side surface S3, and a side surface S4. The main surface F1 and the main surface F2 are surfaces substantially parallel to the X-Y plane, and are opposed to each other in the first direction A1. The side surface S1 and the side surface S4 are surfaces substantially parallel to the X-Z plane, and are opposed to each other in the second direction A2. The side surface S2 and the side surface S3 are surfaces substantially parallel to the Y-Z plane, and are opposed to each other in the third direction A3. In the example shown in FIG. 1, the side surface S1 and the side surface S4 are surfaces along the short sides of the transparent substrate 1, and the side surface S2 and the side surface S3 are surfaces along the long sides of the transparent substrate 1. Note that the side surface S1 and the side surface S4 may be surfaces along the long sides of the transparent substrate 1 with the side surface S2 and the side surface S3 being surfaces along the short sides of the transparent substrate 1.

The liquid crystal layer 21 is disposed on the main surface F2 side of the transparent substrate 1. The liquid crystal layer 22 is disposed on the liquid crystal layer 21. Details of the liquid crystal layers 21 and 22 will be described later.

The photovoltaic cell PV1 is opposed to the side surface S1 of the transparent substrate 1 in the second direction A2. The photovoltaic cell PV1 is attached to the side surface S1 by a transparent adhesive layer.

Examples of the photovoltaic cell PV1 include a silicon photovoltaic cell, an organic thin-film photovoltaic cell, etc. The silicon photovoltaic cell is formed with amorphous silicon, microcrystalline silicon, monocrystalline silicon, polycrystalline silicon, etc. The organic thin-film photovoltaic cell includes an organic semiconductor photovoltaic cell, a perovskite photovoltaic cell, etc., and may have optical transparency depending on the material used.

FIG. 2 is a cross-sectional view along line A-B of the photovoltaic cell device 10 shown in FIG. 1.

The liquid crystal layer 21 comprises a cholesteric liquid crystal CL1 composed of liquid crystal molecules as schematically shown in an enlarged manner. The cholesteric liquid crystal CL1 has a helical axis AX1 substantially parallel to the first direction A1 and has a helical pitch P1 in the first direction A1.

The liquid crystal layer 22 comprises a cholesteric liquid crystal CL2 composed of liquid crystal molecules as schematically shown in an enlarged manner. The cholesteric liquid crystal CL2 has a helical axis AX2 substantially parallel to the first direction A1 and has a helical pitch P2 in the first direction A1.

The helical pitches P1 and P2 each indicate one cycle of the helix (thickness in the first direction A1 necessary for liquid crystal molecules to rotate 360 degrees).

Each of the liquid crystal layers 21 and 22 is configured to reflect circularly polarized light of a selective reflection band determined according to the helical pitch and the refractive anisotropy, of light LTi incident through the transparent substrate 1. In the present specification, "reflection" in the liquid crystal layers 21 and 22 involves diffraction inside the liquid crystal layers 21 and 22.

The liquid crystal layer 21 comprises a reflective surface R1 which reflects circularly polarized light corresponding to the turning direction of the cholesteric liquid crystal CL1, of the selective reflection band.

The liquid crystal layer 22 comprises a reflective surface R2 which reflects circularly polarized light corresponding to the turning direction of the cholesteric liquid crystal CL2, of the selective reflection band.

In the present specification, circularly polarized light may be precise circularly polarized light or may be circularly polarized light approximate to elliptically polarized light.

The reflective surfaces R1 and R2, which will be described later in detail, are each inclined with respect to the X-Y plane to face toward the photovoltaic cell PV1. Note that the reflective surface R1 is inclined in a direction different from that of the reflective surface R2. In the Y-Z cross section, a normal N1 of the reflective surface R1 is represented as an arrow of a broken line extending from the liquid crystal layer 21 toward the transparent substrate 1, and a normal N2 of the reflective surface R2 is represented as an arrow of a broken line extending from the liquid crystal layer 22 toward the transparent substrate 1. The normal N1 is not parallel to the normal N2.

In the example shown in FIG. 2, the turning direction of the cholesteric liquid crystal CL1 is different from the turning direction of the cholesteric liquid crystal CL2. In addition, the helical pitch P1 of the cholesteric liquid crystal CL1 is equal to the helical pitch P2 of the cholesteric liquid crystal CL2. Moreover, the refractive anisotropy in the liquid crystal layer 21 is equal to the refractive anisotropy in the liquid crystal layer 22.

That is, the selective reflection band in the liquid crystal layer 21 is equal to the selective reflection band in the liquid crystal layer 22. In addition, circularly polarized light reflected by the reflective surface R1 is light circularly polarized in the opposite direction to that of circularly polarized light reflected by the reflective surface R2.

The optical action of the photovoltaic cell device 10 will be described next.

The example shown in the figure illustrates a case where each of the liquid crystal layers 21 and 22 reflects part of light LTi incident from the transparent substrate 1 side toward the transparent substrate 1.

Light LTi incident on the photovoltaic cell device 10 is, for example, solar light, and includes visible light, ultraviolet rays, and infrared rays. To facilitate understanding, it is herein assumed that light LTi is incident substantially perpendicularly to the transparent substrate 1. The angle of incidence of light LTi to the transparent substrate 1 is not particularly limited.

Light LTi enters the inside of the transparent substrate 1 from the main surface F1, is emitted from the main surface F2, and is incident on the liquid crystal layer 21. Then, the liquid crystal layer 21 reflects part of light LTi at the reflective surface R1 toward the transparent substrate 1, and transmits the other light. Reflected light LTr1 is, for example, circularly polarized light I1 in the wavelength band of infrared rays.

Light LTt transmitted through the liquid crystal layer 21 is incident on the liquid crystal layer 22. Then, the liquid crystal layer 22 reflects part of light LTt at the reflective surface R2 toward the transparent substrate 1, and transmits the other light. Reflected light LTr2 is, for example, circularly polarized light I2 in the wavelength band of infrared rays. Circularly polarized light I2 is light circularly polarized in the opposite direction to that of circularly polarized light I1. Light LTt transmitted through the liquid crystal layer 22 includes, for example, visible light and ultraviolet rays.

The angle θi1 of entry at which light LTr1 reflected by the liquid crystal layer 21 enters the transparent substrate 1 and the angle θi2 of entry at which light LTr2 reflected by the liquid crystal layer 22 enters the transparent substrate 1 are set to satisfy the conditions for optical waveguide in the transparent substrate 1. The angles θi1 and θi2 of entry here should preferably be angles greater than or equal to the critical angle θc which causes total reflection at the interface between the transparent substrate 1 and the air. The angles θi1 and θi2 of entry are angles to a perpendicular line orthogonal to the main surface F1 of the transparent substrate 1.

If the transparent substrate 1, the liquid crystal layer 21, and the liquid crystal layer 22 have equivalent refractive indices, the stacked layer body of these can be a single optical waveguide body. In this case, light LTr1 and light LTr2 are guided toward the side surface S1 while being reflected repeatedly by the interface between the transparent substrate 1 and the air and the interface between the liquid crystal layer 22 and the air. Light LTr1 and light LTr2 emitted from the side surface S1 are used for power generation in the photovoltaic cell PV1.

Figure 3:
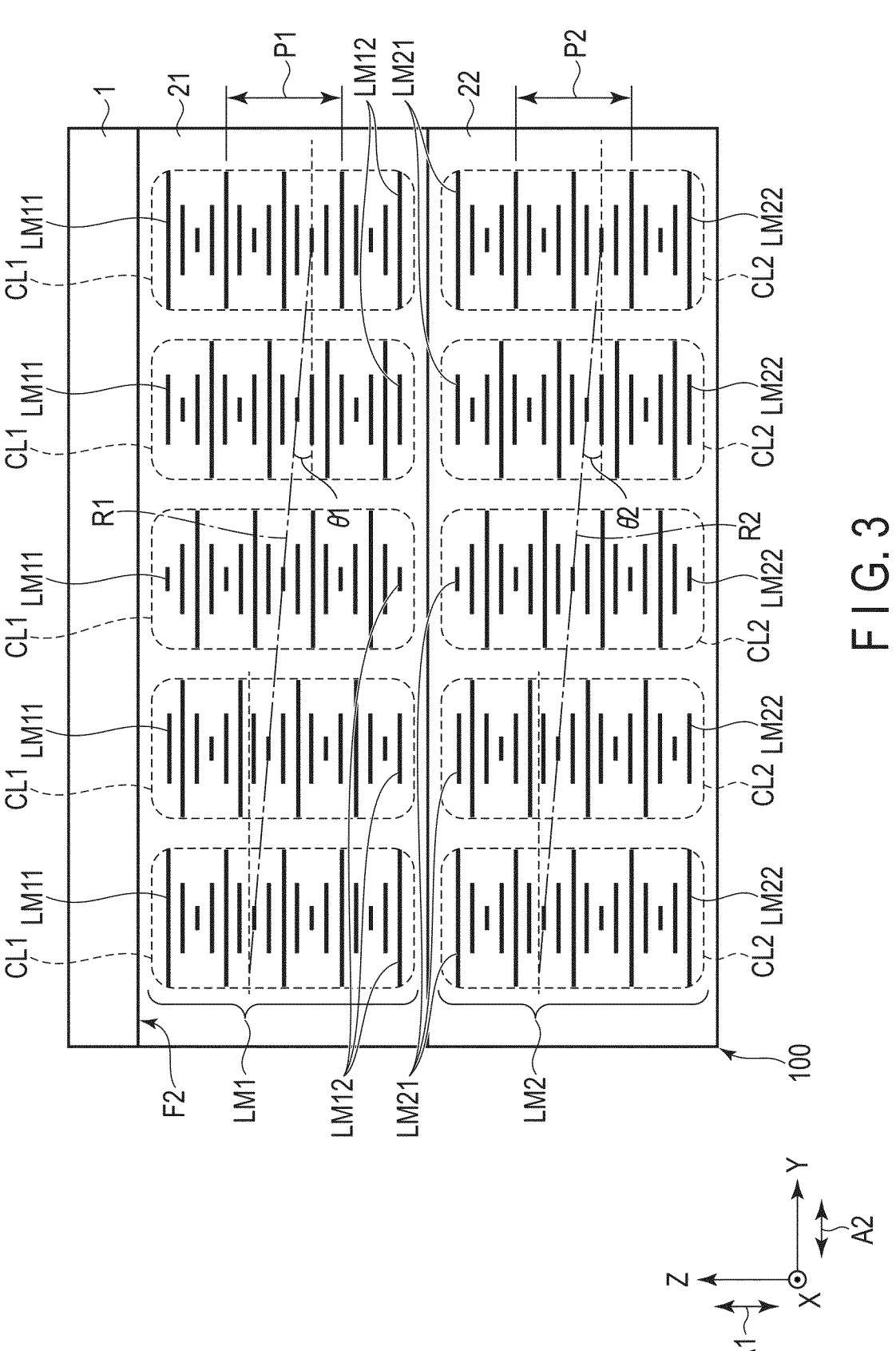
FIG. 3 is a cross-sectional view for explaining an example of cholesteric liquid crystals CL1 included in a liquid crystal layer 21 and cholesteric liquid crystals CL2 included in a liquid crystal layer 22.

FIG. 3 is a cross-sectional view for explaining an example of cholesteric liquid crystals CL1 included in the liquid crystal layer 21 and cholesteric liquid crystals CL2 included in the liquid crystal layer 22.

In FIG. 3, the liquid crystal layers 21 and 22 are shown in a state of being enlarged in the first direction A1. In addition, for the sake of simplification, one liquid crystal molecule LM1 of the liquid crystal molecules located in the same plane parallel to the X-Y plane is shown in the figure as liquid crystal molecules LM1 constituting the cholesteric liquid crystals CL1. The alignment direction of the liquid crystal molecule LM1 shown in the figure corresponds to the average alignment direction of the liquid crystal molecules located in the same plane. Similarly, one liquid crystal molecule LM2 of the liquid crystal molecules located in the same plane parallel to the X-Y plane is shown in the figure as liquid crystal molecules LM2 constituting the cholesteric liquid crystals CL2.

Each cholesteric liquid crystal CL1 enclosed by a broken line is constituted of liquid crystal molecules LM1 stacked helically in the first direction A1 while being turned. The liquid crystal molecules LM1 comprise a liquid crystal molecule LM11 on one end side of the cholesteric liquid crystals CL1 and a liquid crystal molecule LM12 on the other end side of the cholesteric liquid crystals CL1. The liquid crystal molecule LM11 is close to the transparent substrate 1. The liquid crystal molecule LM12 is close to the liquid crystal layer 22.

In the cross-sectional view shown in the figure, the alignment directions of adjacent cholesteric liquid crystals CL1 are different from each other. That is, the alignment directions of adjacent liquid crystal molecules LM11 are different from each other. In addition, the alignment directions of adjacent liquid crystal molecules LM12 are also different from each other. The alignment directions of the liquid crystal molecules LM11 change continuously, for example, from the left to the right of the figure. The alignment directions of the liquid crystal molecules LM12 also change continuously.

The reflective surface R1 indicated by an alternate long and short dashed line in the figure is inclined with respect to the main surface F2 parallel to the X-Y plane. The angle formed by the reflective surface R1 and the X-Y plane is referred to as an angle θ1 of inclination of the reflective surface R1. The angle θ1 of inclination is an acute angle. The reflective surface R1 corresponds to a surface along which the alignment directions of the liquid crystal molecules LM1 are identical or a surface along which the spatial phases are the same (equiphase wave surface).

Each cholesteric liquid crystal CL2 enclosed by a broken line is constituted of liquid crystal molecules LM2 stacked helically in the first direction A1 while being turned. The liquid crystal molecules LM2 comprise a liquid crystal molecule LM21 on one end side of the cholesteric liquid crystals CL2 and a liquid crystal molecule LM22 on the other end side of the cholesteric liquid crystals CL2. The liquid crystal molecule LM21 is close to the liquid crystal layer 21. The liquid crystal molecule LM22 is close to the interface between the liquid crystal layer 22 and an air layer.

In the cross-sectional view shown in the figure, the alignment directions of adjacent cholesteric liquid crystals CL2 are different from each other. That is, the alignment directions of adjacent liquid crystal molecules LM21 are different from each other. In addition, the alignment directions of adjacent liquid crystal molecules LM22 are also different from each other. The alignment directions of the liquid crystal molecules LM21 change continuously, for example, from the left to the right of the figure. The alignment directions of the liquid crystal molecules LM22 also change continuously.

The reflective surface R2 indicated by an alternate long and short dashed line in the figure is inclined with respect to the main surface F2 parallel to the X-Y plane. The angle formed by the reflective surface R2 and the X-Y plane is referred to as an angle θ2 of inclination of the reflective surface R2. The angle θ2 of inclination is an acute angle. The reflective surface R2 corresponds to a surface along which the alignment directions of the liquid crystal molecules LM2 are identical or a surface along which the spatial phases are the same (equiphase wave surface).

Each of the above-described liquid crystal layers 21 and 22 is cured in a state in which the alignment directions of the liquid crystal molecules are fixed. That is, the alignment directions of the liquid crystal molecules are not controlled in accordance with an electric field. For this reason, the liquid crystal optical element 100 does not comprise an electrode for forming an electric field in the liquid crystal layers 21 and 22.

In general, in a liquid crystal layer comprising a cholesteric liquid crystal, a selective reflection band Δλ for perpendicularly incident light is expressed as equation (1) below, based on the helical pitch P of the cholesteric liquid crystal and the refractive anisotropy Δn (difference between the refractive index ne for extraordinary light and the refractive index no for ordinary light) of the liquid crystal layer.

$$\Delta\lambda = \Delta n * P \tag{1}$$

The specific wavelength range of the selective reflection band Δλ is no*P to ne*P.

The center wavelength λm of the selective reflection band Δλ is expressed as equation (2) below, based on the helical pitch P of the cholesteric liquid crystal and the average refractive index nav (=(ne+no)/2) of the liquid crystal layer.

$$\lambda m = nav * P \tag{2}$$

In the examples shown in FIG. 2 and FIG. 3, the liquid crystal layers 21 and 22 have the same selective reflection band Δλ and further have the same center wavelength λm.

The above-described examples have illustrated a case where infrared rays of solar light are included in the selective reflection band, but the embodiments are not limited to this case. A desired selective reflection band can be achieved by adjusting the refractive anisotropy Δn and the helical pitch P.

FIG. 4 is a diagram showing an example of the alignment patterns of the liquid crystal molecules LM11 and the liquid crystal molecules LM21 shown in FIG. 3.

An arrow D1 shown in the liquid crystal layer 21 corresponds to an orthographic projection of the normal N1 of the reflective surface R1 shown in FIG. 2 on the X-Y plane, and indicates the light-guide direction of light LTr1 reflected by the reflective surface R1. An arrow D2 shown in the liquid crystal layer 22 corresponds to an orthographic projection of the normal N2 of the reflective surface R2 shown in FIG. 2 on the X-Y plane, and indicates the light-guide direction of light LTr2 reflected by the reflective surface R2. The light-guide direction D1 is a direction different from the light-guide direction D2. In addition, each of the light-guide directions D1 and D2 is a direction intersecting the X-axis and the Y-axis.

In the liquid crystal layer 21, the respective alignment directions of the liquid crystal molecules LM11 arranged in the light-guide direction D1 are different from each other. In the example shown in the figure, the respective alignment directions of the liquid crystal molecules LM11 arranged in the light-guide direction D1 change by equal angles counterclockwise along the arrow indicating the light-guide direction D1. Here, the amount of change of the alignment directions of adjacent liquid crystal molecules LM11 is constant in the light-guide direction D1, but may increase gradually or may decrease gradually.

On the other hand, in the liquid crystal layer 21, the respective alignment directions of the liquid crystal molecules LM11 arranged in a direction orthogonal to the light-guide direction D1 are substantially identical.

In the liquid crystal layer 22, the respective alignment directions of the liquid crystal molecules LM21 arranged in the light-guide direction D2 are different from each other. In the example shown in the figure, the respective alignment directions of the liquid crystal molecules LM21 arranged in the light-guide direction D2 change by equal angles clockwise along the arrow indicating the light-guide direction D2. Here, the amount of change of the alignment directions of adjacent liquid crystal molecules LM21 is constant in the light-guide direction D2, but may increase gradually or may decrease gradually.

On the other hand, in the liquid crystal layer 22, the respective alignment directions of the liquid crystal molecules LM21 arranged in a direction orthogonal to the light-guide direction D2 are substantially identical.

The alignment directions of the liquid crystal molecules LM11 and LM21 here correspond to the major-axis directions of the liquid crystal molecules LM11 and LM21 in the X-Y plane.

FIG. 5 is a plan view showing the relationship between the light-guide directions D1 and D2.

As described above, in the plan view of the arrow indicating the normal N1 of the reflective surface R1 shown in FIG. 2, the normal N1 is coincident with the light-guide direction D1 in the X-Y plane. In addition, in the plan view of the arrow indicating the normal N2 of the reflective surface R2 shown in FIG. 2, the normal N2 is coincident with the light-guide direction D2 in the X-Y plane. Since the reflective surface R1 is inclined in a direction different from that of the reflective surface R2, the light-guide direction D1 is not coincident with the light-guide direction D2. In the X-Y plane, the angle α formed by the light-guide direction D1 (or the normal N1) and the light-guide direction D2 (or the normal N2) is greater than 0° but less than 180°.

The arrow indicating the light-guide direction D1 points toward the side surface S1 and the side surface S2. That is, light reflected by the reflective surface R1 is guided toward the side surface S1 and the side surface S2.

The arrow indicating the light-guide direction D2 points toward the side surface S1 and the side surface S3. That is, light reflected by the reflective surface R2 is guided toward the side surface S1 and the side surface S3.

In the photovoltaic cell device 10, in which the photovoltaic cell PV1 is disposed along the side surface S1, it is preferable that the angle α be greater than 0° but less than or equal to 90°. In addition, it is preferable that the light-guide directions D1 and D2 be in line symmetry with respect to a normal NS1 of the side surface S1.

In the above-described photovoltaic cell device 10, the liquid crystal optical element 100 comprises liquid crystal layers having different light-guide directions. Therefore, as compared to that in a case where the light-guide directions are limited to one direction, the fluctuations of diffraction efficiency are reduced when the angle of incidence of solar light changes with time and season. In addition, even if the angle of incidence of solar light changes, light of a wavelength band used for power generation (for example, infrared rays) of solar light can be guided stably to the photovoltaic cell PV1, and the fluctuations of power generation efficiency in the photovoltaic cell PV1 can be suppressed.

Moreover, in the example shown in FIG. 2, right-handed circularly polarized light and left-handed circularly polarized light of the wavelength band used for power generation are reflected by the liquid crystal layers 21 and 22, respectively, and are guided to the photovoltaic cell PV1. Thus, the efficiency of light utilization improves.

On the other hand, the selective reflection bands in the liquid crystal layers 21 and 22 hardly include the wavelength band of visible light. This suppresses the undesired coloring of light transmitted through the liquid crystal optical element 100.

Other configuration examples of the photovoltaic cell device 10 will be described next.

FIG. 6 is another cross-sectional view along line A-B of the photovoltaic cell device 10 shown in FIG. 1. A configuration example shown in FIG. 6 is different from the configuration example shown in FIG. 2 in the configurations of the liquid crystal layer 21 and the liquid crystal layer 22. To be specific, the helical pitch P1 of the cholesteric liquid crystal CL1 is different from the helical pitch P2 of the cholesteric liquid crystal CL2. As in the configuration example shown in FIG. 2, the turning direction of the cholesteric liquid crystal CL1 is different from the turning direction of the cholesteric liquid crystal CL2 and the refractive anisotropy in the liquid crystal layer 21 is equal to the refractive anisotropy in the liquid crystal layer 22.

That is, in the configuration example shown in FIG. 6, the center wavelength of the first selective reflection band in the liquid crystal layer 21 is different from the center wavelength of the second selective reflection band in the liquid crystal layer 22, and further, circularly polarized light reflected by the reflective surface R1 is light circularly polarized in the opposite direction to that of circularly polarized light reflected by the reflective surface R2. However, it is possible that the first selective reflection band does not overlap the second selective reflection band or overlaps part of the second selective reflection band.

More specifically, the liquid crystal layer 21 reflects light LTr1, which is part of light LTi, at the reflective surface R1 toward the transparent substrate 1, and transmits the other light. The liquid crystal layer 22 reflects light LTr2, which is part of light LTi, at the reflective surface R2 toward the transparent substrate 1, and transmits the other light. The center wavelength λ1 of light LTr1 is different from the center wavelength λ2 of light LTr2.

In this configuration example, the wavelength band used for power generation can be widened.

FIG. 7 is another cross-sectional view along line A-B of the photovoltaic cell device 10 shown in FIG. 1. A configuration example shown in FIG. 7 is different from the configuration example shown in FIG. 2 in the configurations of the liquid crystal layer 21 and the liquid crystal layer 22. To be specific, the helical pitch P1 of the cholesteric liquid crystal CL1 is different from the helical pitch P2 of the cholesteric liquid crystal CL2, and further, the turning direction of the cholesteric liquid crystal CL1 is the same as the turning direction of the cholesteric liquid crystal CL2. As in the configuration example shown in FIG. 2, the refractive anisotropy in the liquid crystal layer 21 is equal to the refractive anisotropy in the liquid crystal layer 22.

That is, in the configuration example shown in FIG. 7, the center wavelength of the first selective reflection band in the liquid crystal layer 21 is different from the center wavelength of the second selective reflection band in the liquid crystal layer 22, and further, circularly polarized light reflected by the reflective surface R1 is light circularly polarized in the same direction as that of circularly polarized light reflected by the reflective surface R2. However, it is possible that the first selective reflection band does not overlap the second selective reflection band or overlaps part of the second selective reflection band.

In this configuration example, too, the wavelength band used for power generation can be widened as in the configuration example shown in FIG. 6.

FIG. 8 is another plan view of the photovoltaic cell device 10. A configuration example shown in FIG. 8 is different from the configuration example shown in FIG. 5, etc., in that the photovoltaic cell device 10 further comprises photovoltaic cells PV2 and PV3.

As in the above-described configuration examples, the photovoltaic cell PV1 is opposed to the side surface S1. The photovoltaic cell PV2 is opposed to the side surface S2, and is attached to the side surface S2 with a transparent adhesive layer. The photovoltaic cell PV3 is opposed to the side surface S3, and is attached to the side surface S3 with a transparent adhesive layer. As the photovoltaic cells PV2 and PV3, photovoltaic cells of the same type as that of the above-described photovoltaic cell PV1 may be applied or photovoltaic cells of a type different from that of the photovoltaic cell PV1 may be applied.

The liquid crystal optical element 100 may comprise the liquid crystal layer 21 and the liquid crystal layer 22 which have been described with reference to FIG. 2, or may comprise the liquid crystal layer 21 and the liquid crystal layer 22 which have been described with reference to FIG. 6, or may comprise the liquid crystal layer 21 and the liquid crystal layer 22 which have been described with reference to FIG. 7.

In the X-Y plane, the angle α formed by the light-guide direction D1 (or the normal N1) and the light-guide direction D2 (or the normal N2) is greater than 0° but less than 180°. In addition, in the photovoltaic cell device 10, in which the photovoltaic cells PV1 to PV3 are disposed, it is preferable that the angle α be greater than 90° but less than or equal to 180°.

In the above description, the photovoltaic cell device 10 comprises two liquid crystal layers 21 and 22, but is not limited to this. The photovoltaic cell device 10 may comprise three or more liquid crystal layers. While the liquid crystal layers each comprise a cholesteric liquid crystal, the turning direction, the helical pitch, and the refractive anisotropy of the cholesteric liquid crystal can be freely selected as appropriate according to the desired characteristics.

Figure 9:
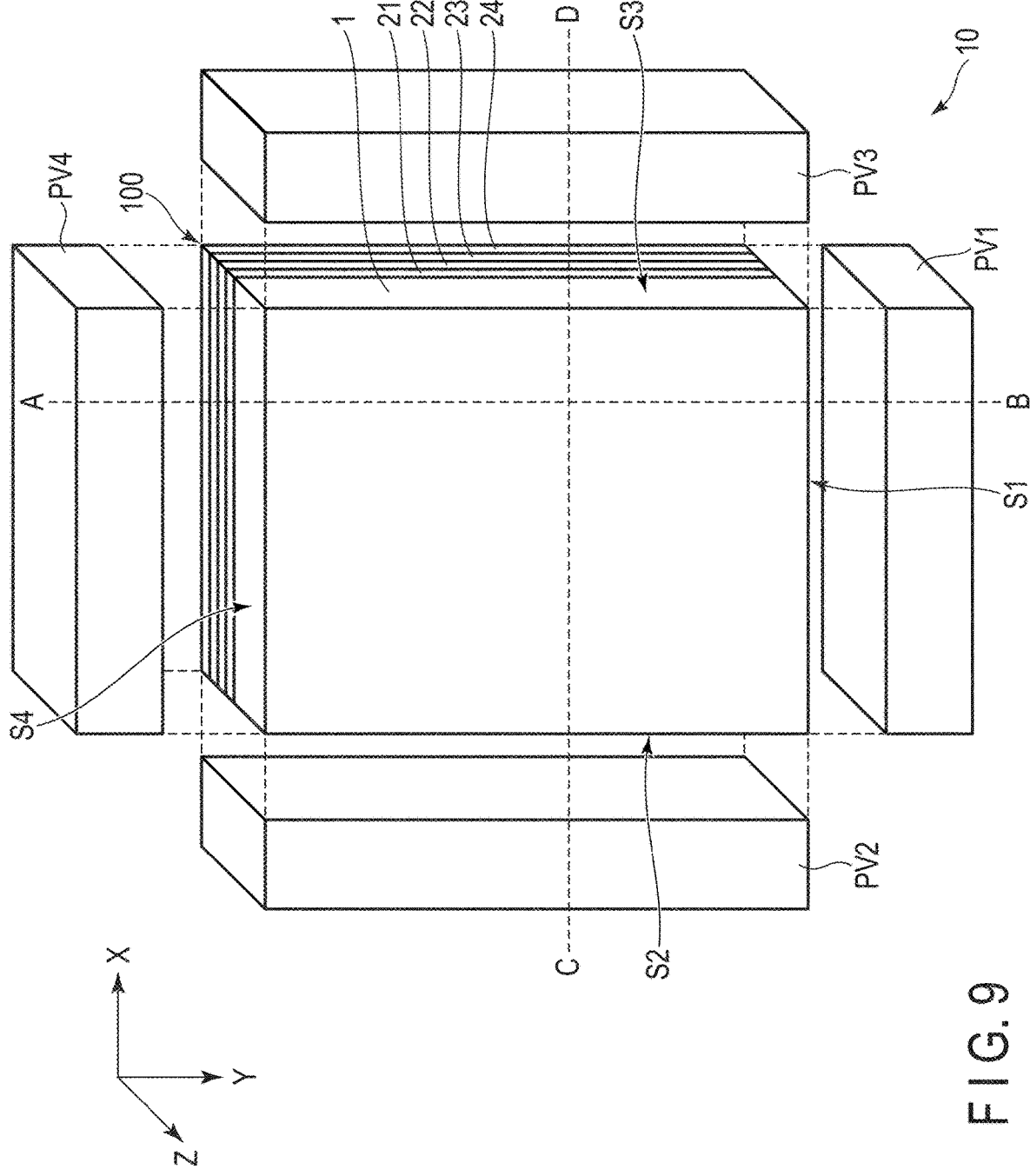
FIG. 9 is another exploded perspective view of the photovoltaic cell device 10.

FIG. 9 is another exploded perspective view of the photovoltaic cell device 10. A configuration example shown in FIG. 9 is different from the configuration example shown in FIG. 1, etc., in that the photovoltaic cell device 10 further comprises liquid crystal layers 23 and 24 and photovoltaic cells PV2 to PV4.

The liquid crystal layer 21 is disposed on the transparent substrate 1. The liquid crystal layer 22 is disposed on the liquid crystal layer 21. The liquid crystal layer 23 is disposed on the liquid crystal layer 22. The liquid crystal layer 24 is disposed on the liquid crystal layer 23. The liquid crystal layers 23 and 24 both comprise a cholesteric liquid crystal, which will be described later.

The photovoltaic cell PV1 is opposed to the side surface S1, and is attached to the side surface S1 with a transparent adhesive layer. The photovoltaic cell PV2 is opposed to the side surface S2, and is attached to the side surface S2 with a transparent adhesive layer. The photovoltaic cell PV3 is opposed to the side surface S3, and is attached to the side surface S3 with a transparent adhesive layer. The photovoltaic cell PV4 is opposed to the side surface S4, and is attached to the side surface S4 with a transparent adhesive layer. As the photovoltaic cells PV2 to PV4, photovoltaic cells of the same type as that of the above-described photovoltaic cell PV1 may be applied or photovoltaic cells of a type different from that of the photovoltaic cell PV1 may be applied.

Figure 10:
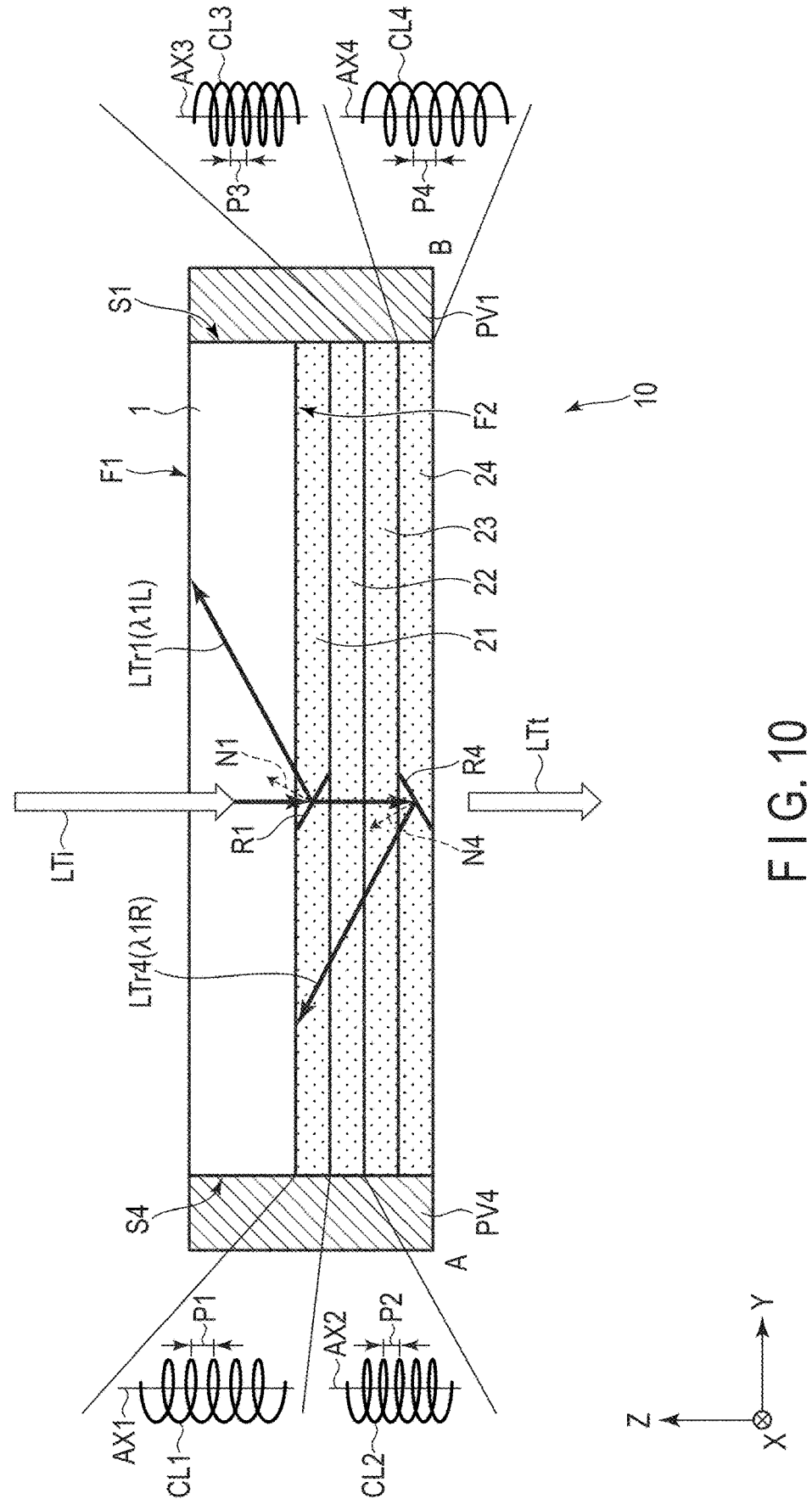
FIG. 10 is a cross-sectional view along line A-B of the photovoltaic cell device 10 shown in FIG. 9.

FIG. 10 is a cross-sectional view along line A-B of the photovoltaic cell device 10 shown in FIG. 9.

Figure 11:
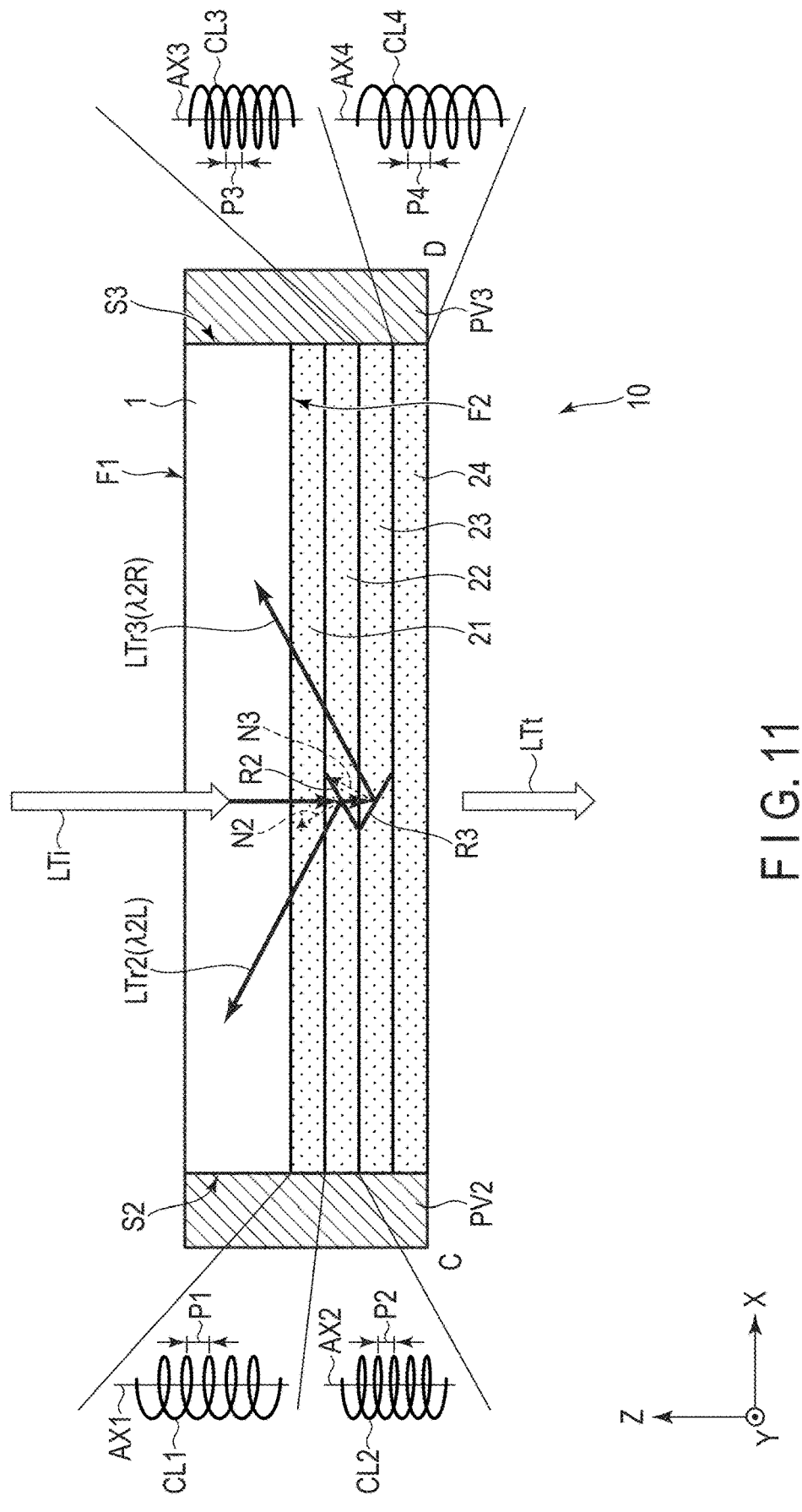
FIG. 11 is a cross-sectional view along line C-D of the photovoltaic cell device 10 shown in FIG. 9.

FIG. 11 is a cross-sectional view along line C-D of the photovoltaic cell device 10 shown in FIG. 9.

The liquid crystal layer 21 comprises the cholesteric liquid crystal CL1 composed of liquid crystal molecules as schematically shown in an enlarged manner. The cholesteric liquid crystal CL1 has the helical axis AX1 substantially parallel to the first direction A1 and has the helical pitch P1 in the first direction A1.

The liquid crystal layer 22 comprises the cholesteric liquid crystal CL2 composed of liquid crystal molecules as schematically shown in an enlarged manner. The cholesteric liquid crystal CL2 has the helical axis AX2 substantially parallel to the first direction A1 and has the helical pitch P2 in the first direction A1.

The liquid crystal layer 23 comprises a cholesteric liquid crystal CL3 composed of liquid crystal molecules as schematically shown in an enlarged manner. The cholesteric liquid crystal CL3 has a helical axis AX3 substantially parallel to the first direction A1 and has a helical pitch P3 in the first direction A1.

The liquid crystal layer 24 comprises a cholesteric liquid crystal CL4 composed of liquid crystal molecules as schematically shown in an enlarged manner. The cholesteric liquid crystal CL4 has a helical axis AX4 substantially parallel to the first direction A1 and has a helical pitch P4 in the first direction A1.

The liquid crystal layer 21 comprises the reflective surface R1, which reflects circularly polarized light corresponding to the turning direction of the cholesteric liquid crystal CL1, of the selective reflection band.

The liquid crystal layer 22 comprises the reflective surface R2, which reflects circularly polarized light corresponding to the turning direction of the cholesteric liquid crystal CL2, of the selective reflection band.

The liquid crystal layer 23 comprises a reflective surface R3 which reflects circularly polarized light corresponding to the turning direction of the cholesteric liquid crystal CL3, of the selective reflection band.

The liquid crystal layer 24 comprises a reflective surface R4 which reflects circularly polarized light corresponding to the turning direction of the cholesteric liquid crystal CL4, of the selective reflection band.

In the example shown in FIG. 10, the reflective surface R1 is inclined with respect to the X-Y plane to face toward the photovoltaic cell PV1. In addition, the reflective surface R4 is inclined with respect to the X-Y plane to face toward the photovoltaic cell PV4. In the Y-Z cross section, the normal N1 of the reflective surface R1 is represented an as an arrow of a broken line extending from the liquid crystal layer 21 toward the transparent substrate 1, and a normal N4 of the reflective surface R4 is represented as an arrow of a broken line extending from the liquid crystal layer 24 toward the transparent substrate 1. The normal N1 is not parallel to the normal N4.

In the example shown in the figure, the turning direction of the cholesteric liquid crystal CL1 is different from the turning direction of the cholesteric liquid crystal CL4. In addition, the helical pitch P1 of the cholesteric liquid crystal CL1 is equal to the helical pitch P4 of the cholesteric liquid crystal CL4.

That is, the selective reflection band in the liquid crystal layer 21 is equal to the selective reflection band in the liquid crystal layer 24. In addition, circularly polarized light reflected by the reflective surface R1 is light circularly polarized in the opposite direction to that of circularly polarized light reflected by the reflective surface R4.

In the example shown in FIG. 11, the reflective surface R2 is inclined with respect to the X-Y plane to face toward the photovoltaic cell PV2. In addition, the reflective surface R3 is inclined with respect to the X-Y plane to face toward the photovoltaic cell PV3. In the X-Z cross section, the normal N2 of the reflective surface R2 is represented as an arrow of a broken line extending from the liquid crystal layer 22 toward the transparent substrate 1, and a normal N3 of the reflective surface R3 is represented as an arrow of a broken line extending from the liquid crystal layer 23 toward the transparent substrate 1. The normal N2 is not parallel to normal N3.

In the example shown in the figure, the turning direction of the cholesteric liquid crystal CL2 is different from the turning direction of the cholesteric liquid crystal CL3. In addition, the helical pitch P2 of the cholesteric liquid crystal CL2 is equal to the helical pitch P3 of the cholesteric liquid crystal CL3. Further, the turning direction of the cholesteric liquid crystal CL2 is the same as the turning direction of the cholesteric liquid crystal CL1. In addition, the helical pitch P2 is different from the helical pitch P1.

That is, the selective reflection band in the liquid crystal layer 22 is equal to the selective reflection band in the liquid crystal layer 23. In addition, circularly polarized light reflected by the reflective surface R2 is light circularly polarized in the opposite direction to that of circularly polarized light reflected by the reflective surface R3. Moreover, the selective reflection band in the liquid crystal layer 22 is different from the selective reflection band in the liquid crystal layer 21.

In the examples shown in FIG. 10 and FIG. 11, the configurations of the liquid crystal layers 21 to 24 are not limited to the above-described examples. For example, the helical pitch P1 may be different from the helical pitch P4, the helical pitch P2 may be different from the helical pitch P3, the turning direction of the cholesteric liquid crystal CL1 may be different from the turning direction of the cholesteric liquid crystal CL2, and the turning direction of the cholesteric liquid crystal CL3 may be different from the turning direction of the cholesteric liquid crystal CL4.

As shown in FIG. 10, the liquid crystal layer 21 reflects light LTr1, which is part of light LTi, at the reflective surface R1 toward the transparent substrate 1, and transmits the other light. The liquid crystal layer 24 reflects light LTr4, which is part of light LTi, at the reflective surface R4 toward the transparent substrate 1, and transmits the other light.

Light LTr1 is left-handed circularly polarized light $\lambda 1L$ of the center wavelength $\lambda 1$, and is guided toward the photovoltaic cell PV1 and used for power generation in the photovoltaic cell PV1. Light LTr4 is right-handed circularly polarized light AIR of the center wavelength λ1, and is guided toward the photovoltaic cell PV4 and used for power generation in the photovoltaic cell PV4.

As shown in FIG. 11, the liquid crystal layer 22 reflects light LTr2, which is part of light LTi, at the reflective surface R2 toward the transparent substrate 1, and transmits the other light. The liquid crystal layer 23 reflects light LTr3, which is part of light LTi, at the reflective surface R3 toward the transparent substrate 1, and transmits the other light.

Light LTr2 is left-handed circularly polarized light λ2L of the center wavelength λ2, and is guided toward the photovoltaic cell PV2 and used for power generation in the photovoltaic cell PV2. Light LTr3 is right-handed circularly polarized light λ2R of the center wavelength λ2, and is guided toward the photovoltaic cell PV3 and used for power generation in the photovoltaic cell PV3. Note that the center wavelength λ2 is different from the center wavelength λ1.

FIG. 12 is a diagram showing an example of the alignment patterns of the liquid crystal molecules LM11 of the liquid crystal layer 21 and liquid crystal molecules LM41 of the liquid crystal layer 24 shown in FIG. 10, and the liquid crystal molecules LM21 of the liquid crystal layer 22 and liquid crystal molecules LM31 of the liquid crystal layer 23 shown in FIG. 11.

An arrow D1 shown in the liquid crystal layer 21 corresponds to an orthographic projection of the normal N1 of the reflective surface R1 shown in FIG. 10 on the X-Y plane, and indicates the light-guide direction of light LTr1 reflected by the reflective surface R1.

An arrow D2 shown in the liquid crystal layer 22 corresponds to an orthographic projection of the normal N2 of the reflective surface R2 shown in FIG. 11 on the X-Y plane, and indicates the light-guide direction of light LTr2 reflected by the reflective surface R2.

An arrow D3 shown in the liquid crystal layer 23 corresponds to an orthographic projection of the normal N3 of the reflective surface R3 shown in FIG. 11 on the X-Y plane, and indicates the light-guide direction of light LTr3 reflected by the reflective surface R3.

An arrow D4 shown in the liquid crystal layer 24 corresponds to an orthographic projection of the normal N4 of the reflective surface R4 shown in FIG. 10 on the X-Y plane, and indicates the light-guide direction of light LTr4 reflected by the reflective surface R4.

The light-guide direction D1, the light-guide direction D2, the light-guide direction D3, and the light-guide direction D4 are directions different from each other.

In the liquid crystal layer 21, the respective alignment directions of the liquid crystal molecules LM11 arranged in the light-guide direction D1 are different from each other. In the example shown in the figure, the respective alignment directions of the liquid crystal molecules LM11 arranged in the light-guide direction D1 change by equal angles counterclockwise along the arrow indicating the light-guide direction D1. In addition, in the liquid crystal layer 21, the respective alignment directions of the liquid crystal molecules LM11 arranged in a direction orthogonal to the light-guide direction D1 are substantially identical.

In the liquid crystal layer 22, the respective alignment directions of the liquid crystal molecules LM21 arranged in the light-guide direction D2 are different from each other. In the example shown in the figure, the respective alignment directions of the liquid crystal molecules LM21 arranged in the light-guide direction D2 change by equal angles counterclockwise along the arrow indicating the light-guide direction D2. In addition, in the liquid crystal layer 22, the respective alignment directions of the liquid crystal molecules LM21 arranged in a direction orthogonal to the light-guide direction D2 are substantially identical.

In the liquid crystal layer 23, the respective alignment directions of the liquid crystal molecules LM31 arranged in the light-guide direction D3 are different from each other. In the example shown in the figure, the respective alignment directions of the liquid crystal molecules LM31 arranged in the light-guide direction D3 change by equal angles counterclockwise along the arrow indicating the light-guide direction D3. In addition, in the liquid crystal layer 23, the respective alignment directions of the liquid crystal molecules LM31 arranged in a direction orthogonal to the light-guide direction D3 are substantially identical.

In the liquid crystal layer 24, the respective alignment directions of the liquid crystal molecules LM41 arranged in the light-guide direction D4 are different from each other. In the example shown in the figure, the respective alignment directions of the liquid crystal molecules LM41 arranged in the light-guide direction D4 change by equal angles counterclockwise along the arrow indicating the light-guide direction D4. In addition, in the liquid crystal layer 24, the respective alignment directions of the liquid crystal molecules LM41 arranged in a direction orthogonal to the light-guide direction D4 are substantially identical.

FIG. 13 is a plan view showing the relationship between the light-guide directions D1 to D4.

The arrow indicating the normal N1 of the reflective surface R1 is coincident with the arrow indicating the light-guide direction D1 in the X-Y plane. The arrow indicating the normal N2 of the reflective surface R2 is coincident with the arrow indicating the light-guide direction D2 in the X-Y plane. The arrow indicating the normal N3 of the reflective surface R3 is coincident with the arrow indicating the light-guide direction D3 in the X-Y plane. The arrow indicating the normal N4 of the reflective surface R4 is coincident with the arrow indicating the light-guide direction D4 in the X-Y plane.

The reflective surface R1, the reflective surface R2, the reflective surface R3, and the reflective surface R4 are inclined in directions different from each other. Thus, the light-guide direction D1, the light-guide direction D2, the light-guide direction D3, and the light-guide direction D4 are directions different from each other.

In the X-Y plane, the angle formed by the light-guide direction D1 (or the normal N1) and the light-guide direction D2 (or the normal N2) is greater than 0° but less than 180°. The angle formed by the light-guide direction D3 (or the normal N3) and the light-guide direction D4 (or the normal N4) is also greater than 0° but less than 180°. In the example shown in the figure, the angle formed by the light-guide direction D1 and the light-guide direction D2, the angle formed by the light-guide direction D2 and the light-guide direction D4, the angle formed by the light-guide direction D3 and the light-guide direction D4, and the angle formed by the light-guide direction D1 and the light-guide direction D3 are 90° each.

The arrow indicating the light-guide direction D1 points toward the side surface S1. That is, light reflected by the reflective surface R1 is guided toward the side surface S1 (or the photovoltaic cell PV1).

The arrow indicating the light-guide direction D2 points toward the side surface S2. That is, light reflected by the reflective surface R2 is guided toward the side surface S2 (or the photovoltaic cell PV2).

The arrow indicating the light-guide direction D3 points toward the side surface S3. That is, light reflected by the reflective surface R3 is guided toward the side surface S3 (or the photovoltaic cell PV3).

The arrow indicating the light-guide direction D4 points toward the side surface S4. That is, light reflected by the reflective surface R4 is guided toward the side surface S4 (or the photovoltaic cell PV4).

In the above-described photovoltaic cell device 10, the photovoltaic cells PV1 to PV4 are disposed to surround the liquid crystal optical element 100, and the liquid crystal optical element 100 comprises the liquid crystal layers which guide solar light toward the photovoltaic cells PV1 to PV4, respectively. Therefore, the fluctuations of diffraction efficiency are reduced when the angle of incidence of solar light changes with time and season. In addition, even if the angle of incidence of solar light changes, light of a wavelength band used for power generation (for example, infrared rays) of solar light can be guided stably to the photovoltaic cell PV1, and the fluctuations of power generation efficiency in the photovoltaic cell PV1 can be suppressed.

Moreover, the wavelength band used for power generation can be widened, and right-handed circularly polarized light and left-handed circularly polarized light are guided to the photovoltaic cells PV1 to PV4. Thus, the efficiency of light utilization improves.

On the other hand, the selective reflection bands in the liquid crystal layers 21 to 24 hardly include the wavelength band of visible light. This suppresses the undesired coloring of light transmitted through the liquid crystal optical element 100.

This configuration example is particularly suitable for a photovoltaic cell device mounted on a moving body.

FIG. 14 is another plan view showing the relationship between the light-guide directions D1 to D4.

A configuration example shown in FIG. 14 is different from the configuration example shown in FIG. 13 in that the light-guide directions D1 to D4 are each rotated 45° in the X-Y plane.

The arrow indicating the light-guide direction D1 points toward the side surface S1 and the side surface S3. That is, light reflected by the reflective surface R1 is guided toward the side surface S1 and the side surface S3.

The arrow indicating the light-guide direction D2 points toward the side surface S1 and the side surface S2. That is, light reflected by the reflective surface R2 is guided toward the side surface S1 and the side surface S2.

The arrow indicating the light-guide direction D3 points toward the side surface S3 and the side surface S4. That is, light reflected by the reflective surface R3 is guided toward the side surface S3 and the side surface S4.

The arrow indicating the light-guide direction D4 points toward the side surface S2 and the side surface S4. That is, light reflected by the reflective surface R4 is guided toward the side surface S2 and the side surface S4.

In this configuration example, too, the same advantage as that of the configuration example described with reference to FIG. 13 can be achieved.

FIG. 15 is another exploded perspective view of the photovoltaic cell device 10. A configuration example shown in FIG. 15 is different from the configuration example shown in FIG. 1, etc., in that the photovoltaic cell device 10 further comprises the liquid crystal layers 23 and 24, the photovoltaic cells PV2 and PV3, and a protective substrate 5.

The liquid crystal layer 21 is disposed on the transparent substrate 1. The liquid crystal layer 22 is disposed on the liquid crystal layer 21. The liquid crystal layer 23 is disposed on the opposite side to the liquid crystal layer 21 with the transparent substrate 1 interposed therebetween. The liquid crystal layer 24 is disposed on the liquid crystal layer 23. The liquid crystal layers 21 to 24 comprise the cholesteric liquid crystals CL1 to CL4, respectively, as in the configuration example shown in FIG. 10, etc.

The protective substrate 5 is a transparent substrate and is a glass plate or a synthetic resin plate. The protective substrate 5 is opposed to the liquid crystal layer 23 in the first direction A1. That is, the liquid crystal layers 23 and 24 are disposed between the transparent substrate 1 and the protective substrate 5. The liquid crystal layers 23 and 24 face the side on which solar light is incident. The protective substrate 5 protects the liquid crystal layers 23 and 24. The transparent protective substrate functions as a light guide which propagates light reflected by each reflective surface, like the transparent substrate 1.

The protective substrate 5 comprises a side surface S5, a side surface S6, a side surface S7, and a side surface S8. The side surface S5 and the side surface S8 are surfaces substantially parallel to the X-Z plane, and are opposed to each other in the second direction A2. The side surface S6 and the side surface S7 are surfaces substantially parallel to the Y-Z plane, and are opposed to each other in the third direction A3.

In the example shown in FIG. 15, the side surface S5 overlaps the side surface S1 in the first direction A1. The side surface S6 overlaps the side surface S2 in the first direction A1. The side surface S7 overlaps the side surface S3 in the first direction A1. The side surface S8 overlaps the side surface S4 in the first direction A1.

The photovoltaic cell PV1 is opposed to the side surface S1 and the side surface S5, and is attached to the side surface S1 and the side surface S5 with a transparent adhesive layer. The photovoltaic cell PV2 is opposed to the side surface S2 and the side surface S6, and is attached to the side surface S2 and the side surface S6 with a transparent adhesive layer. The photovoltaic cell PV3 is opposed to the side surface S3 and the side surface S7, and is attached to the side surface S3 and the side surface S7 with a transparent adhesive layer. As the photovoltaic cells PV2 and PV3, photovoltaic cells of the same type as that of the above-described photovoltaic cell PV1 may be applied or photovoltaic cells of a type different from that of the photovoltaic cell PV1 may be applied.

FIG. 16 is a cross-sectional view along line A-B of the photovoltaic cell device 10 shown in FIG. 15.

FIG. 17 is a cross-sectional view along line C-D of the photovoltaic cell device 10 shown in FIG. 15.

The liquid crystal layer 21 is disposed to be in contact with the main surface F2. The liquid crystal layer 22 is disposed on the liquid crystal layer 21. The liquid crystal layer 24 is disposed to be in contact with the main surface F1. The liquid crystal layer 23 is disposed on the liquid crystal layer 24. The protective substrate 5 is disposed to be in contact with the liquid crystal layer 23.

The liquid crystal layer 21 comprises the reflective surface R1, which reflects circularly polarized light corresponding to the turning direction of the cholesteric liquid crystal CL1, of the selective reflection band.

The liquid crystal layer 22 comprises the reflective surface R2, which reflects circularly polarized light corresponding to the turning direction of the cholesteric liquid crystal CL2, of the selective reflection band.

The liquid crystal layer 23 comprises the reflective surface R3, which reflects circularly polarized light corresponding to the turning direction of the cholesteric liquid crystal CL3, of the selective reflection band.

The liquid crystal layer 24 comprises the reflective surface R4, which reflects circularly polarized light corresponding to the turning direction of the cholesteric liquid crystal CL4, of the selective reflection band.

For example, each of the reflective surfaces R1 and R3 is inclined with respect to the X-Y plane to face toward the photovoltaic cells PV1 and PV2. Each of the reflective surfaces R2 and R4 is inclined with respect to the X-Y plane to face toward the photovoltaic cells PV1 and PV3.

The liquid crystal layer 21 reflects light LTr1, which is part of light LTi, at the reflective surface R1 toward the transparent substrate 1, and transmits the other light. The liquid crystal layer 22 reflects light LTr2, which is part of light LTi, at the reflective surface R2 toward the transparent substrate 1, and transmits the other light. The liquid crystal layer 23 reflects light LTr3, which is part of light LTi, at the reflective surface R3 toward the protective substrate 5, and transmits the other light. The liquid crystal layer 24 reflects light LTr4, which is part of light LTi, at the reflective surface R4 toward the protective substrate 5, and transmits the other light.

Light LTr1, light LTr2, light LTr3, and light LTr4 are guided toward the side surfaces S1 to S3 while being reflected repeatedly by the interface between the protective substrate 5 and the air and the interface between the liquid crystal layer 22 and the air.

Light LTr1 is left-handed circularly polarized light λ1L of the center wavelength λ1, and is guided toward the photovoltaic cells PV1 and PV2 and used for power generation in the photovoltaic cells PV1 and PV2. Light LTr2 is left-handed circularly polarized light λ2L of the center wavelength λ2, and is guided toward the photovoltaic cells PV1 and PV3 and used for power generation in the photovoltaic cells PV1 and PV3.

Light LTr3 is right-handed circularly polarized light λ2R of the center wavelength λ2, and is guided toward the photovoltaic cells PV1 and PV2 and used for power generation in the photovoltaic cells PV1 and PV2. Light LTr4 is right-handed circularly polarized light AIR of the center wavelength λ1, and is guided toward the photovoltaic cells PV1 and PV3 and used for power generation in the photovoltaic cells PV1 and PV3. Note that the center wavelength λ2 is different from the center wavelength λ1.

FIG. 18 is a plan view showing the relationship between the light-guide directions D1 to D4.

The arrow indicating the normal N1 of the reflective surface R1 shown in FIG. 16 is coincident with the arrow indicating the light-guide direction D1 in the X-Y plane. The arrow indicating the normal N2 of the reflective surface R2 is coincident with the arrow indicating the light-guide direction D2 in the X-Y plane. The arrow indicating the normal N3 of the reflective surface R3 is coincident with the arrow indicating the light-guide direction D3 in the X-Y plane. The arrow indicating the normal N4 of the reflective surface R4 is coincident with the arrow indicating the light-guide direction D4 in the X-Y plane.

For example, the reflective surface R1 and the reflective surface R2 are inclined in directions different from each other, whereas the reflective surface R1 and the reflective surface R3 are parallel to each other and the reflective surface R2 and the reflective surface R4 are parallel to each other. Thus, the light-guide direction D1 and the light-guide direction D3 are parallel to each other, and the light-guide direction D2 and the light-guide direction D4 are parallel to each other.

In the X-Y plane, the angle α formed by the light-guide direction D1 (or the normal N1) and the light-guide direction D2 (or the normal N2) is greater than 0° but less than 180°. The angle formed by the light-guide direction D3 (or the normal N3) and the light-guide direction D4 (or the normal N4) is also greater than 0° but less than 180°.

The arrows indicating the light-guide direction D1 and the light-guide direction D3 point toward the side surface S1 and the side surface S2. That is, light reflected by the reflective surface R1 and the reflective surface R3 is guided toward the side surface S1 and the side surface S2 (or the photovoltaic cell PV1 and the photovoltaic cell PV2).

The arrows indicating the light-guide direction D2 and the light-guide direction D4 point toward the side surface S1 and the side surface S3. That is, light reflected by the reflective surface R2 and the reflective surface R4 is guided toward the side surface S1 and the side surface S3 (or the photovoltaic cell PV1 and the photovoltaic cell PV3).

The above-described photovoltaic cell device reduces the fluctuations of diffraction efficiency and can suppress the fluctuations of power generation efficiency as in the above-described configuration examples.

In addition, the liquid crystal layers 21 and 22 are disposed on the back surface side of the transparent substrate 1, whereas the liquid crystal layers 23 and 24 are disposed on the front surface side (side on which solar light is incident) of the transparent substrate 1 as well. In addition, the liquid crystal layers 23 and 24 are covered by the protective substrate 5. Thus, the liquid crystal layers 23 and 24 are protected.

While several configuration examples have been described above, the configuration examples can be combined as appropriate.

Alignment films 3 which can be interposed between the transparent substrate 1 and a liquid crystal layer and between stacked liquid crystal layers will be described with reference to FIG. 19.

An alignment film 3 interposed between the transparent substrate 1 and the liquid crystal layer 21 and an alignment film 3 interposed between the liquid crystal layer 21 and the liquid crystal layer 22 will be described here. The alignment films 3 are formed of, for example, polyimide. The alignment films 3 are subjected to predetermined alignment treatment. For example, optical alignment treatment by two-beam interference exposure with a beam of first circularly polarized light and a beam of second circularly polarized light which is circularly polarized in the opposite direction to that of the first circularly polarized light is applied as the alignment treatment. The wavelengths of the first circularly polarized light and the second circularly polarized light are, for example, that of ultraviolet rays, but are not limited to this.

The alignment films 3 are exposed to light with the interference pattern of the first circularly polarized light and the second circularly polarized light, and a polarization pattern which changes spatially is thereby recorded as an alignment treatment direction. In this way, alignment restriction force in the alignment treatment direction is given to the alignment films 3.

Then, a liquid crystal material is applied on the alignment films 3, liquid crystal molecules included in the liquid crystal material are thereby aligned in a predetermined direction by the alignment restriction force of the alignment films 3, and an alignment pattern as shown in FIG. 4, etc., is formed.

The above-described alignment films 3 can be applied to each of the above-described configuration examples.

Structures 4 having irregularities which can be interposed between the transparent substrate 1 and a liquid crystal layer between stacked liquid crystal layers will be described next with reference to FIG. 20.

A structure 4 interposed between the transparent substrate 1 and the liquid crystal layer 21 and a structure 4 interposed between the liquid crystal layer 21 and the liquid crystal layer 22 will be described here. The structures 4 are formed of, for example, an organic material. As an example of a technique of forming the structures 4 having irregularities, nanoimprint is applied. For example, an organic material is applied to the transparent substrate 1, a mold is pressed against the organic material, and the organic material is cured by heating or light irradiation. A pattern of minute irregularities formed on the mold is thereby transferred to the organic material, and the structure 4 is formed.

Then, a liquid crystal material is applied on the structure 4, and liquid crystal molecules included in the liquid crystal material are thereby arranged along the pattern of irregularities of the structure 4, and an alignment pattern as shown in FIG. 4, etc., is formed.

The above-described structures 4 can be applied to each of the above-described configuration examples.

As a technique other than the technique described here, in which the alignment films 3 or the structures 4 are used, a liquid crystal layer formed separately may be transferred to the top of the transparent substrate 1 or may be transferred to the top of a liquid crystal layer formed earlier.

In the present embodiment, for example, the main surface F1 of the transparent substrate 1 corresponds to a first main surface, the main surface F2 corresponds to a second main surface, the side surface S1 corresponds to a first side surface, the side surface S2 corresponds to a second side surface, the side surface S3 corresponds to a third side surface, and the side surface S4 corresponds to a fourth side surface.

In addition, the liquid crystal layer 21 corresponds to a first liquid crystal layer, the liquid crystal layer 22 corresponds to a second liquid crystal layer, the liquid crystal layer 23 corresponds to a third liquid crystal layer, the liquid crystal layer 24 corresponds to a fourth liquid crystal layer, the cholesteric liquid crystal CL1 corresponds to a first cholesteric liquid crystal, the cholesteric liquid crystal CL2 corresponds to a second cholesteric liquid crystal, the cholesteric liquid crystal CL3 corresponds to a third cholesteric liquid crystal, the cholesteric liquid crystal CL4 corresponds to a fourth cholesteric liquid crystal, the reflective surface R1 corresponds to a first reflective surface, the reflective surface R2 corresponds to a second reflective surface, the reflective surface R3 corresponds to a third reflective surface, and the reflective surface R4 corresponds to a fourth reflective surface.

Moreover, the photovoltaic cell PV1 corresponds to a first photovoltaic cell, the photovoltaic cell PV2 corresponds to a second photovoltaic cell, the photovoltaic cell PV3 corresponds to a third photovoltaic cell, and the photovoltaic cell PV4 corresponds to a fourth photovoltaic cell.

Furthermore, the side surface S5 of the protective substrate 5 corresponds to a fifth side surface, the side surface S6 corresponds to a sixth side surface, the side surface S7 corresponds to a seventh side surface, and the side surface S8 corresponds to an eighth side surface.

As described above, according to the present embodiment, a photovoltaic cell device which can suppress the fluctuations of power generation efficiency can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photovoltaic cell device comprising:
   a transparent substrate comprising a first main surface, a second main surface opposed to the first main surface, a first side surface, a second side surface intersecting the first side surface, a third side surface opposed to the second side surface, and a fourth side surface opposed to the first side surface;
   a first liquid crystal layer disposed on the second main surface side of the transparent substrate and comprising a first cholesteric liquid crystal;
   a second liquid crystal layer disposed on the first liquid crystal layer and comprising a second cholesteric liquid crystal;
   a third liquid crystal layer disposed on the first main surface side of the transparent substrate and comprising a third cholesteric liquid crystal;
   a transparent protective substrate disposed on the third liquid crystal layer and comprising a fifth side surface located directly above the first side surface, a sixth side surface located directly above the second side surface, and a seventh side surface located directly above the third side surface,
   a first photovoltaic cell facing the first side surface and the fifth side surface;
   a second photovoltaic cell facing the second side surface and the sixth side surface; and
   a third photovoltaic cell facing the third side surface and the seventh side surface, wherein
   the first liquid crystal layer comprises a first reflective surface inclined with respect to the second main surface,
   the second liquid crystal layer comprises a second reflective surface inclined with respect to the second main surface,
   in plan view, an angle formed by a normal of the first reflective surface and a normal of the second reflective surface is greater than 0° but less than 180°, and
   an outer edge of the third liquid crystal layer faces each of the first photovoltaic cell, the second photovoltaic cell, and the third photovoltaic cell.

2. The photovoltaic cell device of claim 1, wherein
   a turning direction of the first cholesteric liquid crystal is different from a turning direction of the second cholesteric liquid crystal, and
   a helical pitch of the first cholesteric liquid crystal is equal to a helical pitch of the second cholesteric liquid crystal.

3. The photovoltaic cell device of claim 1, wherein
   a turning direction of the first cholesteric liquid crystal is different from a turning direction of the second cholesteric liquid crystal, and
   a helical pitch of the first cholesteric liquid crystal is different from a helical pitch of the second cholesteric liquid crystal.

4. The photovoltaic cell device of claim 1, wherein a turning direction of the first cholesteric liquid crystal is the same as a turning direction of the second cholesteric liquid crystal, and a helical pitch of the first cholesteric liquid crystal is different from a helical pitch of the second cholesteric liquid crystal.

5. The photovoltaic cell device of claim 1, further comprising:

a third liquid crystal layer disposed on the second liquid crystal layer and comprising a third cholesteric liquid crystal;

a fourth liquid crystal layer disposed on the third liquid crystal layer and comprising a fourth cholesteric liquid crystal; and a fourth photovoltaic cell facing the fourth side surface, wherein the third liquid crystal layer comprises a third reflective surface inclined with respect to the second main surface, the fourth liquid crystal layer comprises a fourth reflective surface inclined with respect to the second main surface, and in plan view, an angle formed by a normal of the third reflective surface and a normal of the fourth reflective surface is greater than 0° but less than 180°.

6. The photovoltaic cell device of claim 5, wherein in plan view, the angle formed by the normal of the first reflective surface and the normal of the second reflective surface and the angle formed by the normal of the third reflective surface and the normal of the fourth reflective surface are 90°.

7. The photovoltaic cell device of claim 1, further comprising an alignment film interposed between the first liquid crystal layer and the second liquid crystal layer.

8. The photovoltaic cell device of claim 1, further comprising a structure interposed between the first liquid crystal layer and the second liquid crystal layer and having irregularities.

9. The photovoltaic cell device of claim 1, further comprising:

a fourth liquid crystal layer disposed between the first main surface side of the transparent substrate and the third liquid crystal layer, and comprising a fourth cholesteric liquid crystal, wherein an outer edge of the fourth liquid crystal layer faces each of the first photovoltaic cell, the second photovoltaic cell and the third photovoltaic cell.

10. The photovoltaic cell device of claim 9, wherein the first liquid crystal layer is configured to reflect first light toward the first photovoltaic cell and the second photovoltaic cell, the second liquid crystal layer is configured to reflect second light toward the first photovoltaic cell and the third photovoltaic cell, the third liquid crystal layer is configured to reflect third light toward the first photovoltaic cell and the second photovoltaic cell, and the fourth liquid crystal layer is configured to reflect fourth light toward the first photovoltaic cell and the third photovoltaic cell.

11. The photovoltaic cell device of claim 10, wherein a center wavelength of first light is different from a center wavelength of second light, and a center wavelength of third light is different from a center wavelength of fourth light.

12. The photovoltaic cell device of claim 10, wherein first light and second light are circularly polarized in a same direction, third light and fourth light are circularly polarized in a same direction, and first light and third light are circularly polarized in opposite directions.

13. The photovoltaic cell device of claim 1, wherein the transparent protective substrate is located on a side which solar light is incident relative to the transparent substrate.

* * * * *